(12) United States Patent
Oikawa et al.

(10) Patent No.: US 10,620,494 B2
(45) Date of Patent: Apr. 14, 2020

(54) ELECTRO-OPTICAL DEVICE AND ELECTRONIC APPARATUS

(71) Applicant: SEIKO EPSON CORPORATION, Tokyo (JP)

(72) Inventors: Hiroyuki Oikawa, Chitose (JP); Toru Nimura, Matsumoto (JP); Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/232,771

(22) Filed: Dec. 26, 2018

(65) Prior Publication Data

US 2019/0196281 A1 Jun. 27, 2019

(30) Foreign Application Priority Data

Dec. 27, 2017 (JP) ................................ 2017-250706

(51) Int. Cl.
*G02F 1/1362* (2006.01)
*G02F 1/1343* (2006.01)
(Continued)

(52) U.S. Cl.
CPC .. *G02F 1/136209* (2013.01); *G02F 1/136227* (2013.01); *G02F 1/136286* (2013.01);
(Continued)

(58) Field of Classification Search
CPC .. G02F 1/136; G02F 1/1368; G02F 1/136227; G02F 1/136286; G02F 1/133345; G02F 1/136209; G02F 1/133512; G02F 1/13439; G02F 1/134309; G02F 1/136213; G02F 1/134336; G02F 1/1345; G02F 1/1333; G02F 1/1335; G02F 1/1343; G02F 1/1362; G02F 2201/123; G02F 2202/10; G02F 2001/136218; G02F 2001/13685; H01L 27/124; H01L 27/1222;
(Continued)

(56) References Cited

U.S. PATENT DOCUMENTS

2002/0057403 A1 5/2002 Yasukawa et al.
2003/0020064 A1 1/2003 Hashimoto et al.
(Continued)

FOREIGN PATENT DOCUMENTS

JP 2000-10121 A 1/2000
JP 2001-177100 A 6/2001
(Continued)

*Primary Examiner* — Thoi V Duong
(74) *Attorney, Agent, or Firm* — Oliff PLC

(57) ABSTRACT

In an element substrate of an electro-optical device, a semiconductor layer of a transistor has an L shape bending to overlap with both a scanning line and a data line. A first light shielding layer overlaps with a lower layer side of the semiconductor layer. A first light shielding wall and a second light shielding wall are provided on both sides of a semiconductor layer portion between a channel region and a second source/drain region (drain region) of the semiconductor layer. The first light shielding wall and the second light shielding wall to which a constant potential is applied prevent the semiconductor layer portion from being electrically affected even when the first light shielding wall and the second light shielding wall come close to the semiconductor layer portion.

14 Claims, 13 Drawing Sheets

(51) Int. Cl.
*G02F 1/1333* (2006.01)
*G02F 1/1368* (2006.01)
*H01L 27/12* (2006.01)
*H01L 29/786* (2006.01)

(52) U.S. Cl.
CPC ........ *H01L 27/124* (2013.01); *H01L 27/1222* (2013.01); *H01L 27/1248* (2013.01); *H01L 29/78633* (2013.01)

(58) Field of Classification Search
CPC ............. H01L 27/1248; H01L 27/3276; H01L 27/3248; H01L 27/3272; H01L 27/3244; H01L 29/78633; H01L 29/78696; G09G 2300/0426
See application file for complete search history.

(56) References Cited

U.S. PATENT DOCUMENTS

| | | |
|---|---|---|
| 2003/0025848 A1 | 2/2003 | Sera et al. |
| 2003/0234971 A1 | 12/2003 | Murade |
| 2004/0008295 A1 | 1/2004 | Ueda et al. |
| 2004/0051822 A1 | 3/2004 | Sato |
| 2005/0099557 A1 | 5/2005 | Zhang |
| 2014/0203285 A1 | 7/2014 | Ito et al. |

FOREIGN PATENT DOCUMENTS

| | | |
|---|---|---|
| JP | 2002-196362 A | 7/2002 |
| JP | 2003-131261 A | 5/2003 |
| JP | 2003-270663 A | 9/2003 |
| JP | 2003-295168 A | 10/2003 |
| JP | 2004-45576 A | 2/2004 |
| JP | 2004-54033 A | 2/2004 |
| JP | 2004-126557 A | 4/2004 |
| JP | 2004-158518 A | 6/2004 |
| JP | 2004-170656 A | 6/2004 |
| JP | 2005-241910 A | 9/2005 |
| JP | 2006-133791 A | 5/2006 |
| JP | 2006-330763 A | 12/2006 |
| JP | 2007-34327 A | 2/2007 |
| JP | 2007-86816 A | 4/2007 |
| JP | 2008-9447 A | 1/2008 |
| JP | 2012-103385 A | 5/2012 |
| JP | 2014-137526 A | 7/2014 |
| JP | 2015-170642 A | 9/2015 |
| WO | 01/081994 A1 | 11/2001 |

ELECTRO-OPTICAL DEVICE AND ELECTRONIC APPARATUS

BACKGROUND

1. Technical Field

The invention relates to an electro-optical device and an electronic apparatus, in which a semiconductor layer of a pixel switching transistor bends in an L shape.

2. Related Art

In an electro-optical device such as a liquid crystal device, an electro-optical layer is provided between an element substrate on which a pixel electrode and a transistor electrode for pixel switching are formed and a counter substrate facing the element substrate, where, for example, light source light incident from the counter substrate is emitted from the element substrate, is modulated pixel by pixel. In regard with the electro-optical device, there has been proposed an aspect in which the semiconductor layer of the transistor bends in an L shape for addressing a reduction in array pitch of the pixels (see JP-A-2012-103385). In JP-A-2012-103385, it is conceivable that a light shielding wall electrically coupled to a gate electrode is provided on both sides of a semiconductor layer portion between a channel region and a source/drain region, to which an electrode is electrically coupled, of the semiconductor layer, and inhibits an occurrence of optical leakage current caused by the light source light being incident on the semiconductor layer portion.

Unfortunately, a scanning signal supplied to the gate electrode may electrically affect the semiconductor layer portion when the light shielding wall electrically coupled to the gate electrode is provided, as in the structure described in JP-A-2012-103385, on both sides of the semiconductor layer portion between the channel region and the source/drain region, to which an electrode is electrically coupled, of the semiconductor layer. Thus, the semiconductor layer portion needs to be sufficiently spaced apart from the light shielding wall. As a result, an aperture region (a region through which light is allowed to pass) of the pixel is narrowed by the light shielding wall, which unfavorably lowers the utilization efficiency of light.

SUMMARY

In view of the above, an object of the invention is to provide an electro-optical device and electronic apparatus capable of suppressing an aperture region of a pixel from being narrowed even when a light shielding wall is provided in a semiconductor layer bending in an L shape.

In order to achieve the above-described object, one aspect of an electro-optical device of the invention includes a first substrate, a pixel electrode provided on one surface side of the first substrate, a scanning line provided in a layer between the first substrate and the pixel electrode, the scanning line extending in a first direction, a data line provided in a layer between the first substrate and the pixel electrode, the data line extending in a second direction intersecting the scanning line, a transistor provided corresponding to an intersection between the scanning line and the data line, the transistor including a semiconductor layer extending in each of the first direction and the second direction, a gate insulating layer, and a gate electrode electrically coupled to the scanning line, a first light shielding layer provided in a layer between the first substrate and the transistor, the first light shielding layer overlapping in a plan view with the semiconductor layer, a first conductive layer provided in a layer between the transistor and the pixel electrode, the first conductive layer being supplied with a constant potential, and a first interlayer insulating film provided in a layer between the first light shielding layer and the first conductive layer. The first light shielding layer is electrically coupled to the first conductive layer via a first contact hole and a second contact hole provided in the first interlayer insulating film in a manner extending along the semiconductor layer, and at least a source/drain region in the semiconductor layer extends between the first contact hole and the second contact hole when viewed from the first direction or the second direction.

In the invention, the semiconductor layer bending in an L shape can ensure an appropriate channel length even when reducing the size of the semiconductor layer in the first direction and in the second direction. This allows addressing a reduction in array pitch of the pixels and the like. The first light shielding layer overlapping with a first substrate side of the semiconductor layer prevents light incident from the first substrate side from entering the semiconductor layer. The source/drain region extending between the first contact hole and the second contact hole can prevent light such as oblique light and diffracted light from entering the source/drain region by a conductive material formed on an inner side of the first contact hole and the second contact hole. This inhibits an occurrence of optical leakage current. It is herein noted that the conductive material formed on the inner side of the first contact hole and the second contact hole, to which a constant potential is applied, prevents the source/drain region from being electrically affected even when the first contact hole and the second contact hole come close to the source/drain region. Accordingly, the first contact hole and the second contact hole can be brought close to the source/drain region, suppressing narrowing of the aperture region of the pixel.

In the invention, an aspect may be employed in which the source/drain region is electrically coupled to the pixel electrode.

In the invention, an aspect may be employed in which a first light shielding wall formed of a light shielding conductive material is provided on an inner wall of the first contact hole, and a second light shielding wall formed of a light shielding conductive material is provided on an inner wall of the second contact hole. According to the above aspect, the first light shielding wall and the second light shielding wall can effectively prevent light such as oblique light and diffracted light from entering the source/drain region. This inhibits an occurrence of optical leakage current in an effective manner.

In the invention, an aspect may be employed in which at least a semiconductor layer portion in the semiconductor layer overlaps with an end portion on a source/drain region side of the gate electrode via a gate insulating layer, the semiconductor layer portion being located between the first light shielding wall and the second light shielding wall. According to the above aspect, light incident from the first substrate side can be effectively prevented from entering the semiconductor layer portion overlapping, via the gate insulating layer, with the end portion of the gate electrode. This inhibits an occurrence of optical leakage current in an effective manner.

In the invention, an aspect may be employed in which the source/drain region includes a first region electrically coupled to the pixel electrode and a second region interposed between a channel region and the first region, the second region having impurity concentration lower than the first region. The second region is entirely located between the first light shielding wall and the second light shielding wall. According to the above aspect, light can be effectively prevented from entering the second region (Lightly-Doped Drain (LDD) region), which effectively inhibits an occurrence of optical leakage current.

In the invention, an aspect may be employed in which the first light shielding wall and the second light shielding wall extend in the first direction along the semiconductor layer. According to the above aspect, light can be effectively prevented from entering the source/drain region, which effectively inhibits an occurrence of optical leakage current.

In the invention, an aspect may be employed in which the first light shielding wall serves as a first plug for filling the first contact hole, and the second light shielding wall serves as a second plug for filling the second contact hole. According to the above aspect, the first light shielding wall and the second light shielding wall can be formed of materials having a high light shielding property regardless of the material or the like constituting the first conductive layer, which enhances light shielding properties of the first light shielding wall and the second light shielding wall.

In the invention, an aspect may be employed in which the first conductive layer has a light shielding property and overlaps in a plan view with the semiconductor layer portion. According to the above aspect, the first conductive layer prevents light from entering the semiconductor layer portion from a pixel electrode side, which effectively inhibits an occurrence of optical leakage current.

In the invention, an aspect may be employed in which the first light shielding layer extends in the first direction to overlap in a plan view with the scanning line. According to the above aspect, light incident from the first substrate side can be prevented from entering the semiconductor layer, which inhibits an occurrence of optical leakage current.

In the invention, an aspect may be employed, which includes a second light shielding layer overlapping in a plan view with the semiconductor layer in a layer between the first light shielding layer and the semiconductor layer, a third contact hole penetrating through a second interlayer insulating film interposed between the second light shielding layer and the gate electrode on an opposite side of the semiconductor layer portion to the source/drain region in a region overlapping in a plan view with the scanning line, and a third light shielding wall formed of a conductive material covering an inner wall of the third contact hole. According to the above aspect, the third light shielding wall prevents light from entering the semiconductor layer portion and the like from a side on which neither the first light shielding wall nor the second light shielding wall is formed. This further inhibits an occurrence of optical leakage current.

In the invention, an aspect may be employed in which the gate electrode includes a first electrode portion overlapping with the semiconductor layer, and a second electrode portion overlapping in a plan view with the scanning line, the second electrode portion protruding from the first electrode portion toward an opposite side to the source/drain region. The third contact hole is provided at a position overlapping in a plan view with the second light shielding layer and the second electrode portion. According to the above aspect, the third contact hole overlapping in a plan view with the scanning line suppresses the aperture region of the pixel from being narrowed regardless of the provision of the third light shielding wall.

In the invention, an aspect may be employed in which the scanning line is provided in a layer between the gate electrode and the pixel electrode. The gate electrode is electrically coupled, on an opposite side of the semiconductor layer portion to the source/drain region, to the scanning line via a fourth contact hole penetrating through a third interlayer insulating film interposed between the gate electrode and the scanning line. According to the above aspect, the scanning line does not impede the first light shielding wall and the second light shielding wall from being formed unlike the case where the scanning line is provided between the first light shielding layer and the semiconductor layer.

In the invention, an aspect may be employed, which includes a second conductive layer provided in a layer between the first conductive layer and the pixel electrode. The second interlayer insulating film is provided with a fifth contact hole penetrating through a fourth interlayer insulating film in the second interlayer insulating film to partially communicate with the first contact hole, the fourth interlayer insulating film being interposed between the first conductive layer and the second conductive layer, and a sixth contact hole penetrating through the fourth interlayer insulating film to partially communicate with the second contact hole. The first light shielding wall is integrally provided from the fifth contact hole to the first contact hole, and the second light shielding wall is integrally provided from the sixth contact hole to the second contact hole. According to the above aspect, a common potential can be supplied to the first conductive layer via the second conductive layer. The first conductive layer can be electrically coupled to the second conductive layer by means of the first light shielding wall and the second light shielding wall.

In the invention, an aspect may be employed in which the second conductive layer includes a first capacitance electrode. Between the first conductive layer and the pixel electrode is provided a second capacitance electrode overlapping in a plan view with the first capacitance electrode via a dielectric layer. The second capacitance electrode is electrically coupled to the pixel electrode. According to the above aspect, a holding capacitor can be configured by the second conductive layer used as the relay electrode for the first conductive layer.

In the invention, an aspect may be employed, including a second substrate facing the first substrate, a common electrode formed on a surface on a first substrate side of the second substrate, and an electro-optical layer provided between the first substrate and the second substrate. The constant electric potential serves as a common electric potential applied to the common electrode. According to the above aspect, in particular, the semiconductor layer portion is prevented from being electrically affected even when the first light shielding wall and the second light shielding wall come close to the semiconductor layer portion. Accordingly, the first light shielding wall and the second light shielding wall can be brought close to the semiconductor layer portion, suppressing narrowing of the aperture region of the pixel.

The display device according to the invention is used for various types of electronic apparatuses. In the invention, when an electro-optical device is used for a projection-type display device among electronic apparatuses, the projection-type display device is provided with a light source unit configured to emit light supplied to an electro-optical device, and a projection optical system configured to project light modulated by the electro-optical device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
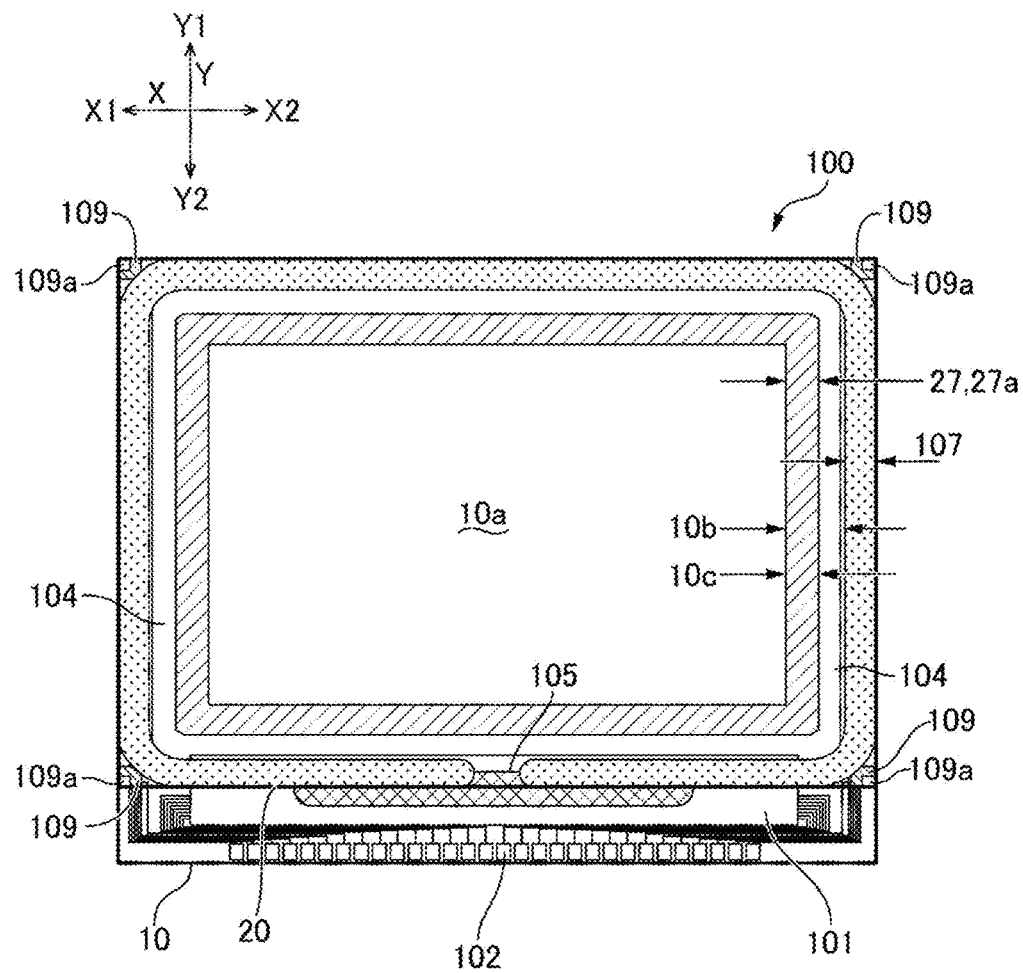
FIG. 1 is a plan view illustrating an electro-optical device to which the invention is applied.

Embodiments of the invention will be described with reference to the drawings. Note that, in the drawings below, to make each layer and each member recognizable in terms of size, the layers and the members are illustrated in different scales. In describing a layer formed on an element substrate in the following description, an upper layer side or a front face side represents an opposite side (a side on which the counter substrate is located) to a side on which a substrate is located, and a lower layer side represents the side on which the substrate is located. In the descriptions below, a side electrically coupled to a data line 6a is referred to as a source and a side electrically coupled to a pixel electrode 9a is referred to as a drain in a source/drain of a transistor 30.

Configuration of Electro-Optical Device

Figure 2:
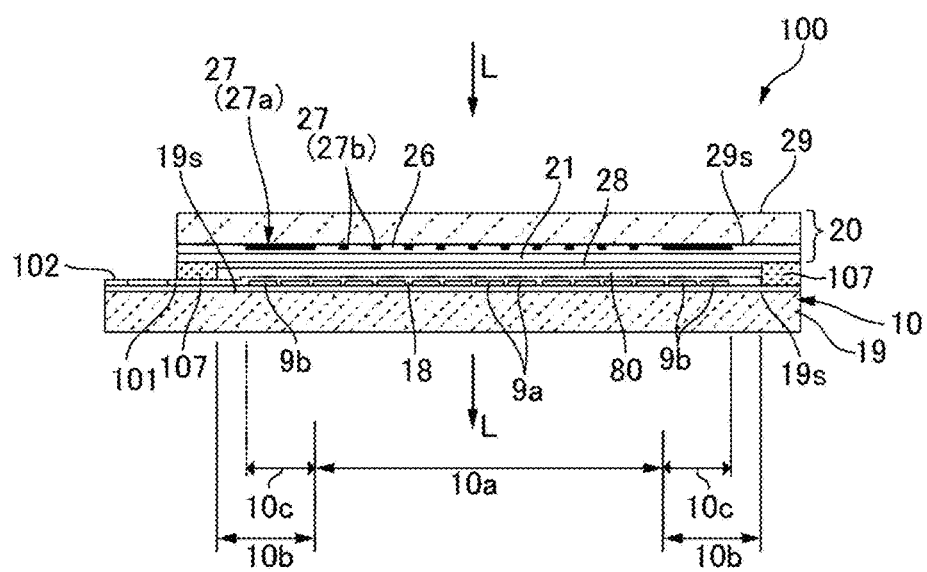
FIG. 2 is a cross-sectional view illustrating the electro-optical device illustrated in FIG. 1.

FIG. 1 is a plan view illustrating an electro-optical device 100 to which the invention is applied. FIG. 2 is a cross-sectional view illustrating the electro-optical device 100 illustrated in FIG. 1. As illustrated in FIGS. 1 and 2, in the electro-optical device 100, an element substrate 10 and a counter substrate 20 are bonded together by a seal material 107 creating a predefined gap, where the element substrate 10 faces the counter substrate 20. The seal material 107 is provided in a frame-like shape along an outer edge of the counter substrate 20, where an electro-optical layer 80 such as a liquid crystal layer is provided in a region surrounded by the seal material 107 between the element substrate 10 and the counter substrate 20. Accordingly, the electro-optical device 100 is configured as a liquid crystal device. The seal material 107 is a photocurable adhesive, or a photocurable and thermosetting adhesive, and further compounded with a gap material such as a glass fiber and glass beads for setting a distance between the substrates to a predefined value. The element substrate 10 and the counter substrate 20 are both formed in a quadrangular shape, and in a substantially central portion of the electro-optical device 100, a display region 10a is provided as a rectangular region. In accordance with the above shapes, the seal material 107 is also formed in a substantially quadrangular shape, and a peripheral region 10b in a quadrangular frame-shape is provided between an inner peripheral edge of the seal material 107 and an outer peripheral edge of the display region 10a.

The element substrate 10 includes, as a substrate body, a first substrate 19 having translucency such as a quartz substrate or a glass substrate. On one surface 19s side of the first substrate 19 on a counter substrate 20 side, a data line drive circuit 101 and a plurality of terminals 102 are formed, outside the display region 10a, along one side of the sides of the element substrate 10, where a scanning line drive circuit 104 is formed along other sides adjacent to the one side. A flexible wiring board (not illustrated) is coupled to the terminal 102, where a variety of potentials and signals are input to the element substrate 10 via the flexible wiring board.

In the display region 10a on one surface 19s of the first substrate 19, a plurality of pixel electrodes 9a having translucency and formed of ITO (Indium Tin Oxide) film or the like, and a transistor for pixel switching (not illustrated in FIG. 2) electrically coupled to each of the plurality of pixel electrodes 9a are formed in a matrix pattern. A first alignment film 18 is formed on the counter substrate 20 side of the pixel electrode 9a, where the pixel electrode 9a is covered with the first alignment film 18.

The counter substrate 20 includes a second substrate 29 having translucency such as a quartz substrate or a glass substrate as a substrate body. A common electrode 21 having translucency and formed of ITO film or the like is formed on the second substrate 29 on one surface 29s side facing the element substrate 10, where a second alignment film 28 is formed on the element substrate 10 side of the common electrode 21. The common electrode 21 is formed over substantially the entire surface of the second substrate 29 and covered by the second alignment film 28. On one surface 29s side of the second substrate 29, a light shielding layer 27 having a light shielding property and formed of resin, metal, or a metal compound is formed on the opposite side of the common electrode 21 to the element substrate 10. A protective layer 26 having translucency is formed between the light shielding layer 27 and the common electrode 21. The light shielding layer 27 is formed, for example, as a partition 27a in a frame-like shape extending along the outer peripheral edge of the display region 10a. The light shielding layer 27 may be occasionally formed as a light shielding layer 27b (black matrix) in a region overlapping in a plan view with a region interposed between the pixel electrodes 9a adjacent to each other. A dummy pixel electrode 9b formed simultaneously with the pixel electrode 9a is formed in the dummy pixel region 10c overlapping in a plan view with the partition 27a in the peripheral region 10b of the element substrate 10.

The first alignment film 18 and the second alignment film 28 are inorganic alignment films (vertical alignment films)

including obliquely vapor-deposited film of $SiO_x$ (x<2), $SiO_2$, $TiO_2$, MgO, $Al_2O_3$, and the like, where liquid crystal molecules having negative dielectric anisotropy used for the electro-optical layer 8 are tilt-oriented. Hence, the liquid crystal molecules form a predefined angle with respect to the element substrate 10 and the counter substrate 20. In this way, the electro-optical device 100 is configured as a liquid crystal device of a vertical alignment (VA) mode.

On the element substrate 10, inter-substrate conduction electrodes 109 for establishing electrical conduction between the element substrate 10 and the counter substrate 20 are formed in regions overlapping, outside of the seal material 107, with corner portions of the counter substrate 20. An inter-substrate conduction material 109a containing conductive particles is disposed on the inter-substrate conduction electrode 109, where the common electrode 21 of the counter substrate 20 is electrically coupled to the element substrate 10 side via the inter-substrate conduction material 109a and the inter-substrate conduction electrode 109. Hence, a common potential is applied to the common electrode 21 from the element substrate 10 side.

In the electro-optical device 100 of the exemplary embodiment, the pixel electrodes 9a and the common electrode 21 are formed of an ITO film (translucent conductive film), where the electro-optical device 100 is configured as a transmissive liquid crystal device. In such an electro-optical device 100, an image is displayed in a manner that light incident on the electro-optical layer 80 from one of the element substrate 10 and the counter substrate 20 is modulated while being emitted through the other one of the substrates. In the exemplary embodiment, as indicated by the arrow L, an image is displayed in a manner that light incident from the opposite substrate 20 is modulated by the electro-optical layer 80 for each of the pixels while being emitted through the element substrate 10.

Electrical Configuration of Electro-Optical Device 100

Figure 3:
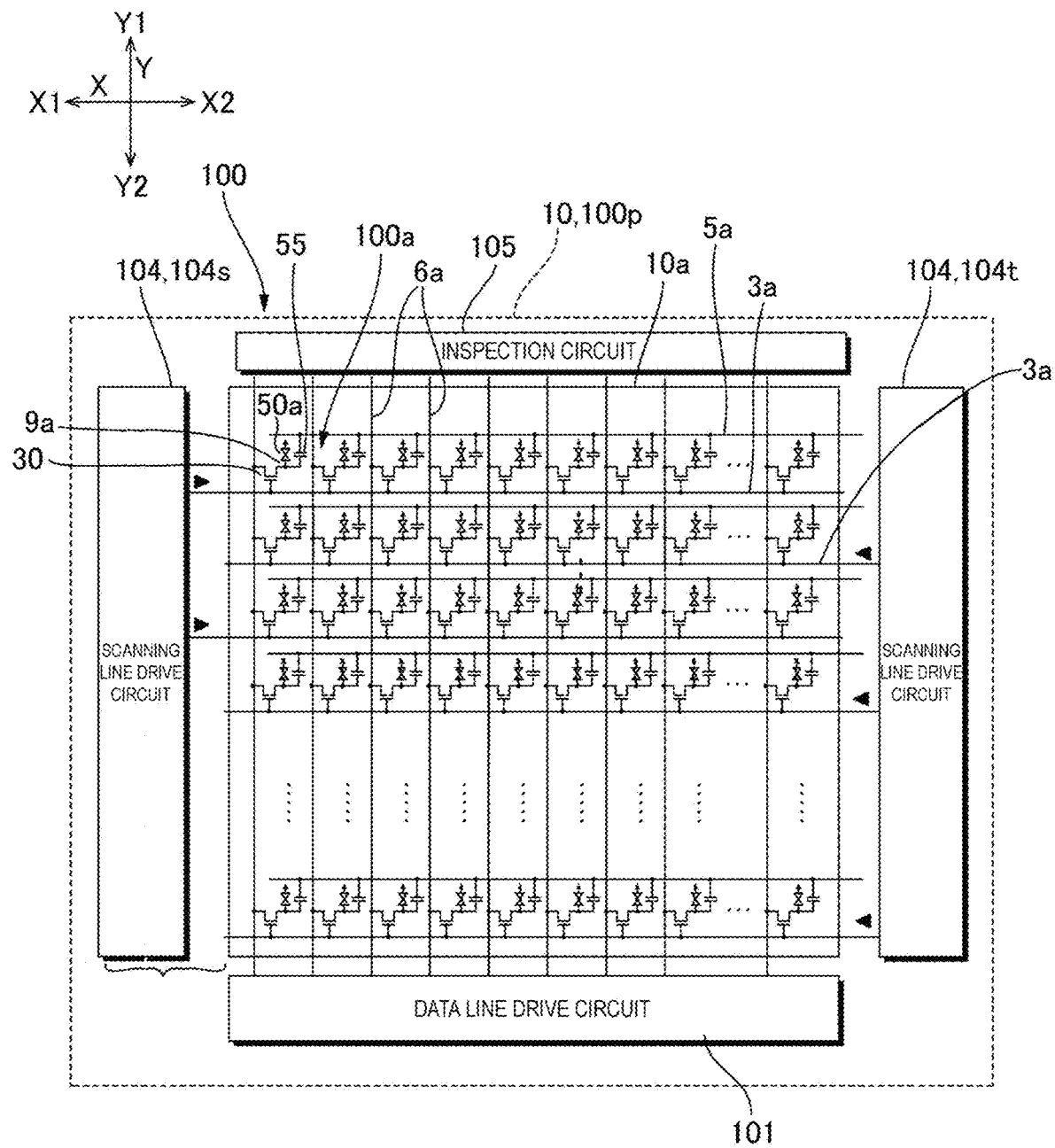
FIG. 3 is a block diagram illustrating an electrical configuration of the electro-optical device illustrated in FIG. 1.

FIG. 3 is a block diagram illustrating an electrical configuration of the electro-optical device 100 illustrated in FIG. 1. In FIG. 3, the electro-optical device 100 includes a liquid crystal panel 100p of VA mode, where in a central region of the display region 10a of the liquid crystal panel 100p, a plurality of pixels 100a are arranged in a matrix pattern. In the electro-optical panel 100p, in the element substrate 10 described above with reference to FIG. 1, FIG. 2, and the like, a plurality of scanning lines 3a extending in a first direction X and a plurality of data lines 6a extending in a second direction Y are formed on the inner side of the display region 10a, where the plurality of pixels 100a are formed corresponding to intersections between the plurality of scanning lines 3a and the plurality of data lines 6a. The plurality of scanning lines 3a are electrically coupled to the scanning line drive circuits 104, and the plurality of data lines 6a are coupled to the data line drive circuit 101. An inspection circuit 105 is electrically coupled to the plurality of data lines 6a on the opposite side to the data line drive circuit 101 in the second direction Y.

In each of the plurality of pixels 100a, there are formed a transistor 30 for pixel switching formed of a field effect transistor or the like, and the pixel electrode 9a electrically coupled to the transistor 30. The data line 6a is electrically coupled to the source of the transistor 30, the scanning line 3a is electrically coupled to the gate of the transistor 30, and the pixel electrode 9a is electrically coupled to the drain of the transistor 30. An image signal is supplied to the data line 6a, and a scanning signal is supplied to the scanning line 3a. In the exemplary embodiment, the scanning line drive circuits 104 are configured as scanning line drive circuits 104s and 104t on one side X1 and the other side X2 in an X direction with respect to the display region 10a, where the scanning line drive circuit 104s on one side X1 in the X direction drives the scanning lines 3a of odd numbers, and the scanning line drive circuit 104t on the other side X2 in the X direction drives the scanning lines 3a of even numbers.

In each of the pixels 100a, the pixel electrode 9a, which faces the common electrode 21 of the second substrate 29 described above with reference to FIG. 1 and FIG. 2 with the electro-optical layer 80 interposed in between, configures a liquid crystal capacitor 50a. A holding capacitor 55 disposed in parallel with the liquid crystal capacitor 50a is added to each pixel 100a to prevent fluctuations of the image signal held by the liquid crystal capacitor 50a. In the exemplary embodiment, capacitance lines 5a extending across the plurality of pixels 100a are formed in the first substrate 19 to configure the holding capacitors 55, where a common potential is supplied to the capacitance lines 5a. In FIG. 3, although one capacitance line 5a is illustrated extending in the first direction X, the capacitance line 5a may be extended in the second direction Y, and may also be occasionally extended in both the first direction X and the second direction Y.

Overview Configuration of Pixel 100a

Figure 4:
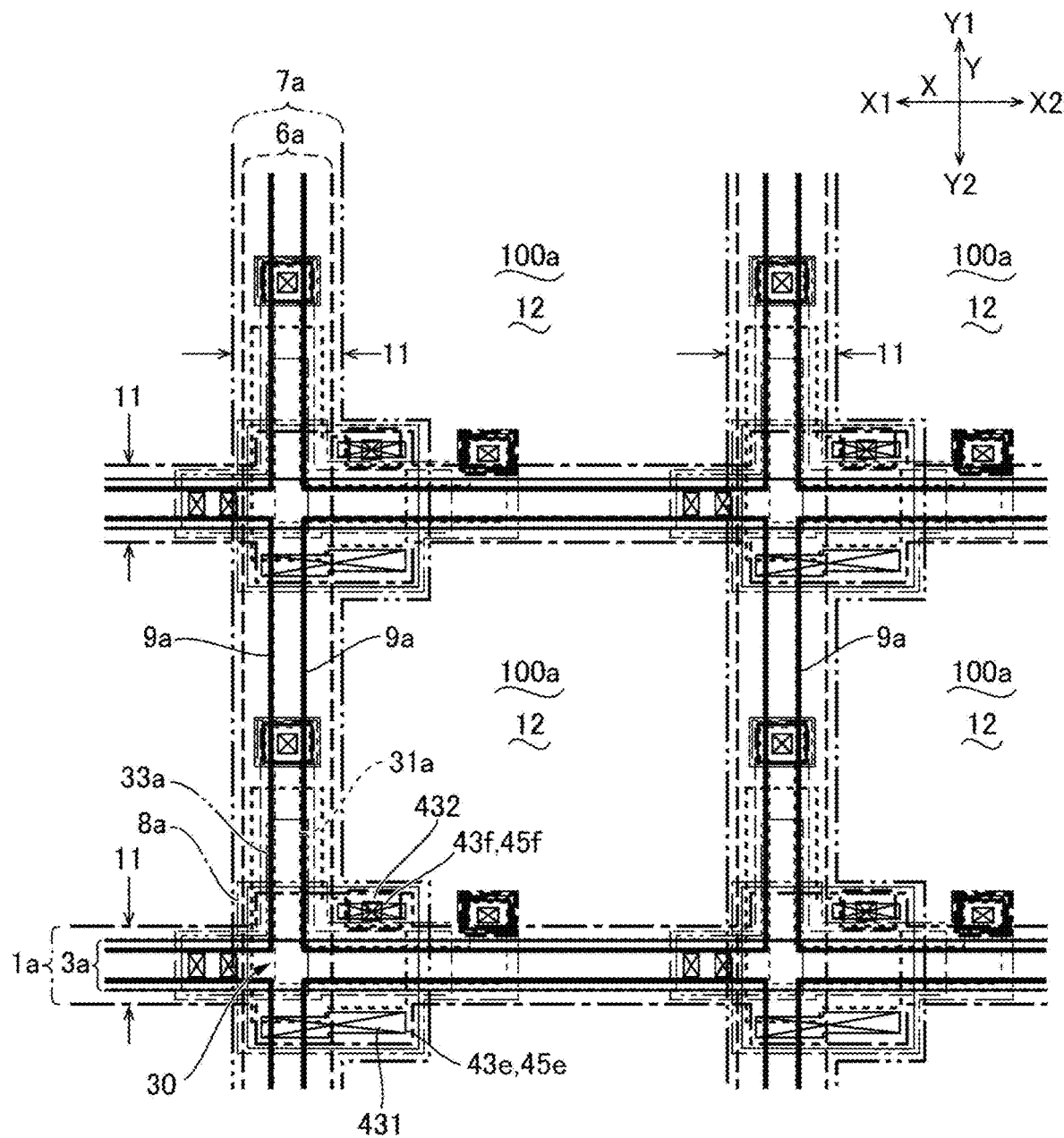
FIG. 4 is a plan view illustrating a plurality of pixels adjacent to each other in the electro-optical device illustrated in FIG. 1.
Figure 5:
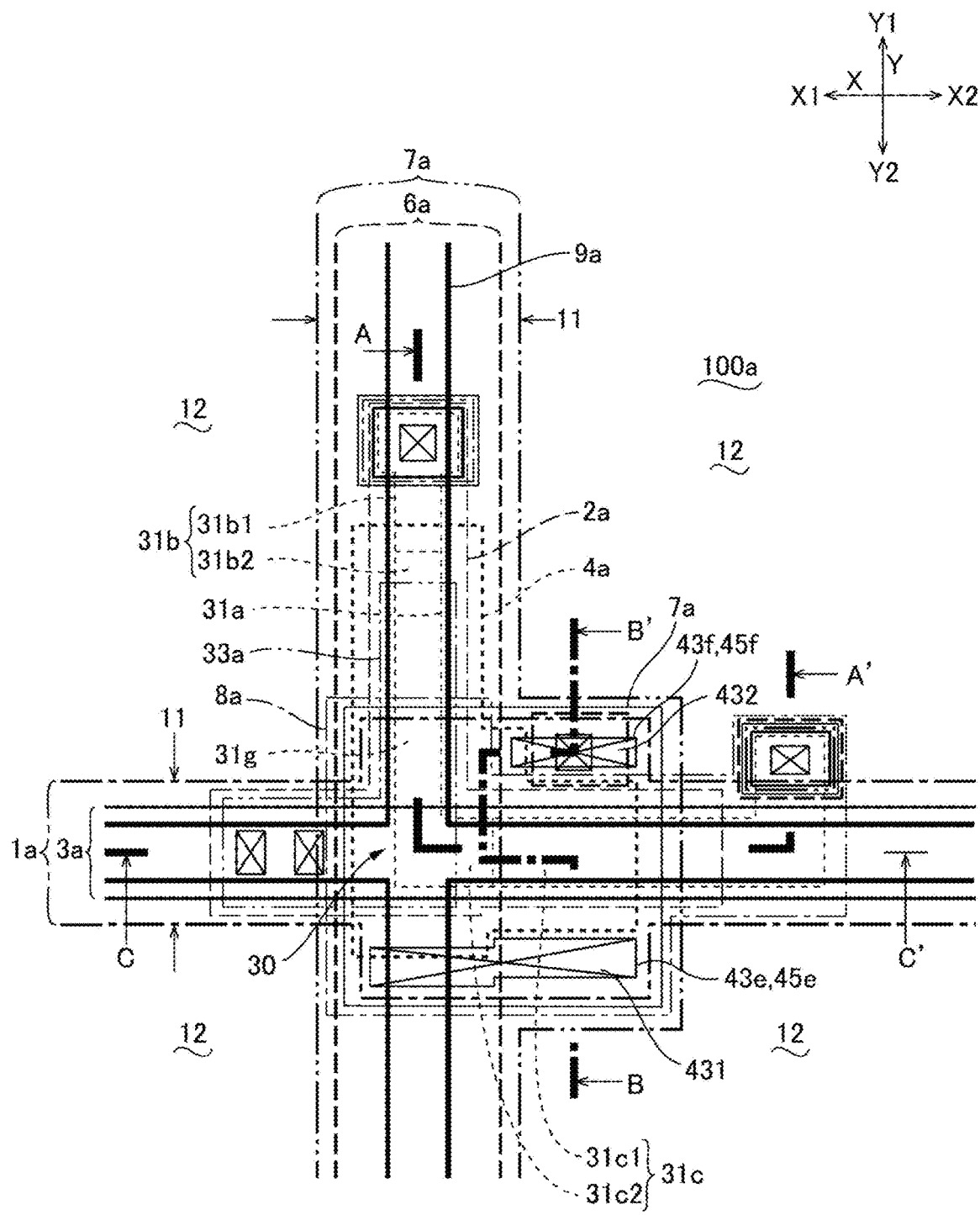
FIG. 5 is an enlarged plan view illustrating one of the pixels illustrated in FIG. 4.
Figure 6:
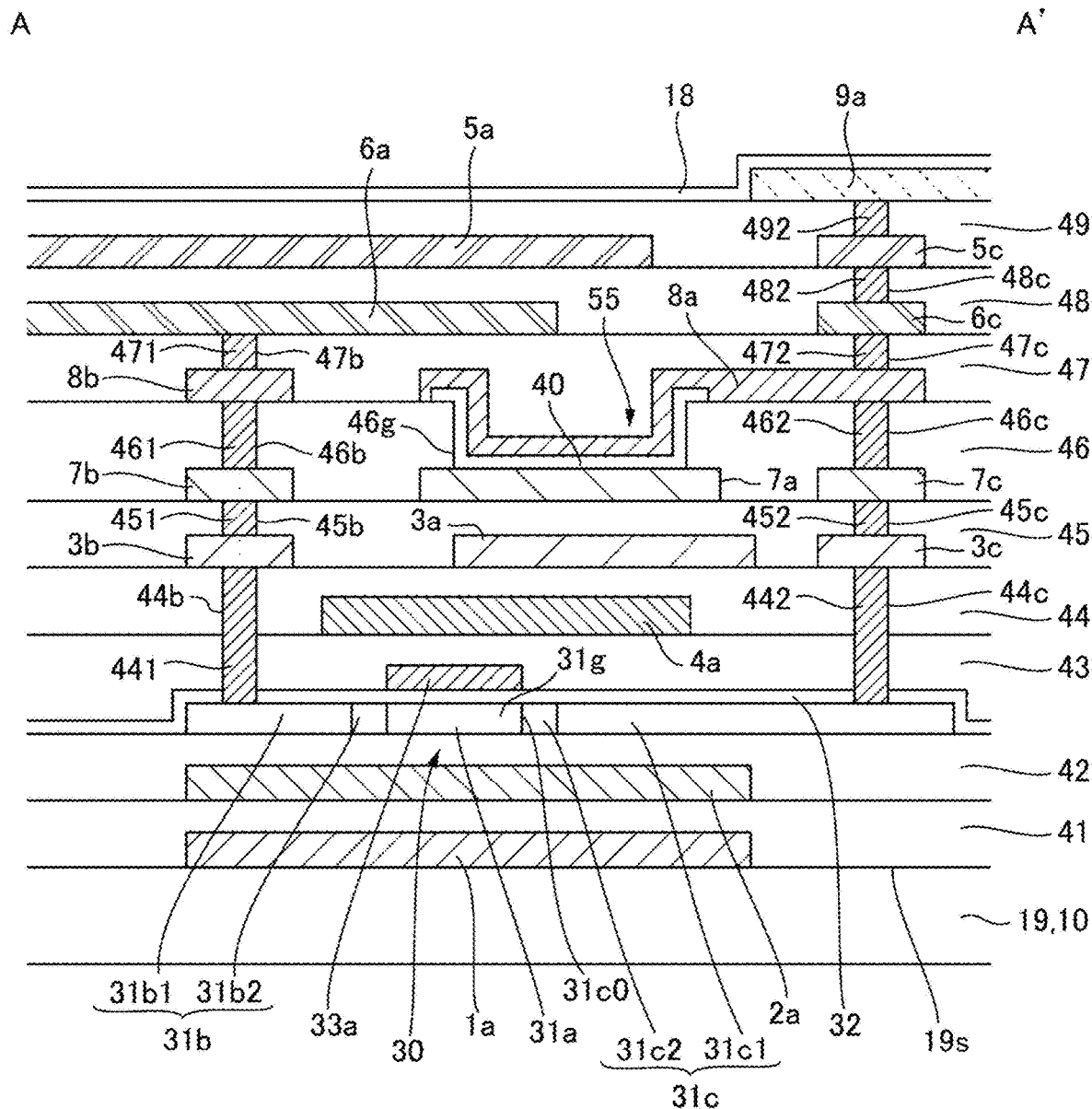
FIG. 6 is a cross-sectional view taken along a line A-A' of the pixel illustrated in FIGS. 4 and 5.
Figure 7:
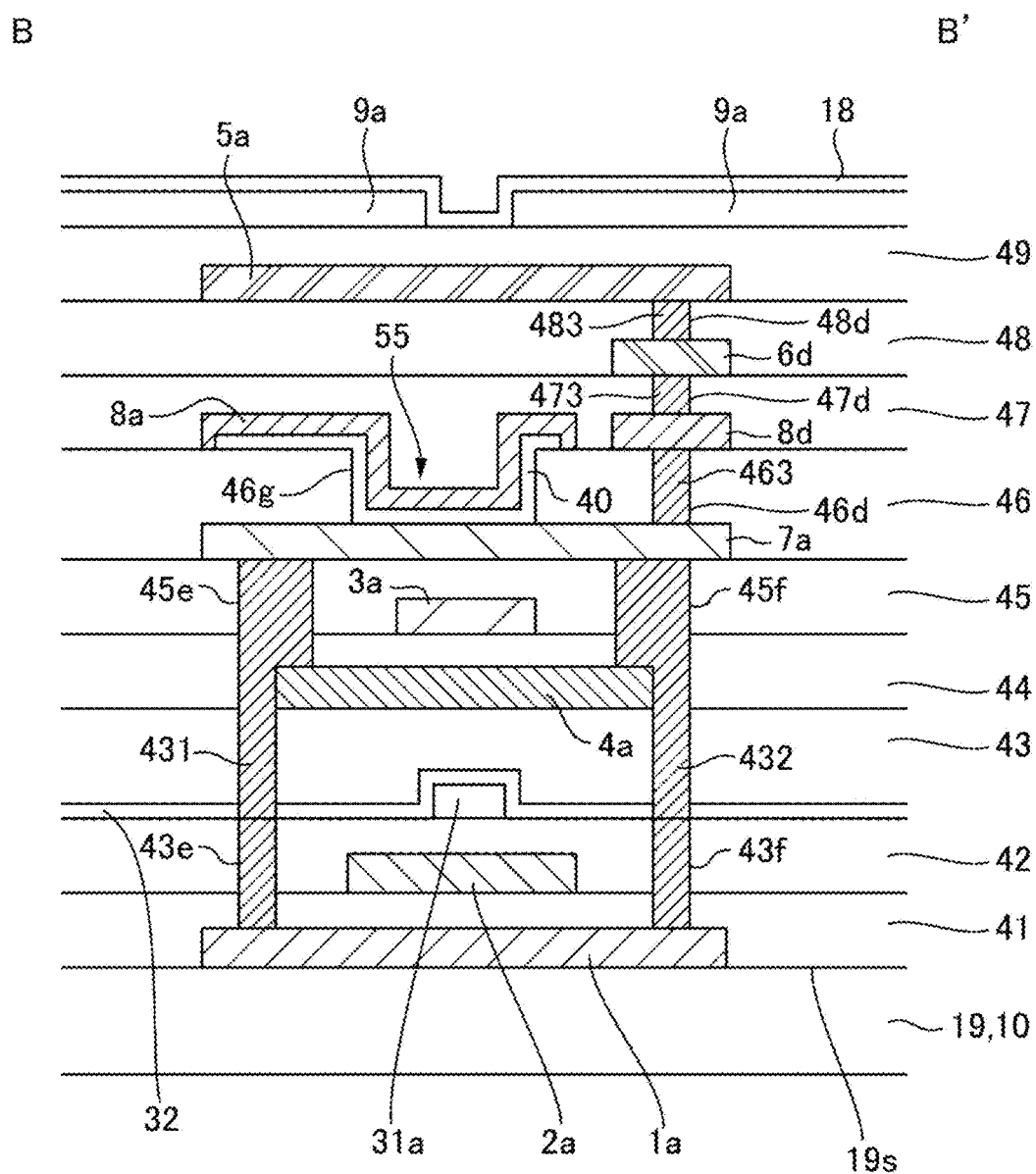
FIG. 7 is a cross-sectional view taken along a line B-B' of the pixel illustrated in FIGS. 4 and 5.
Figure 8:
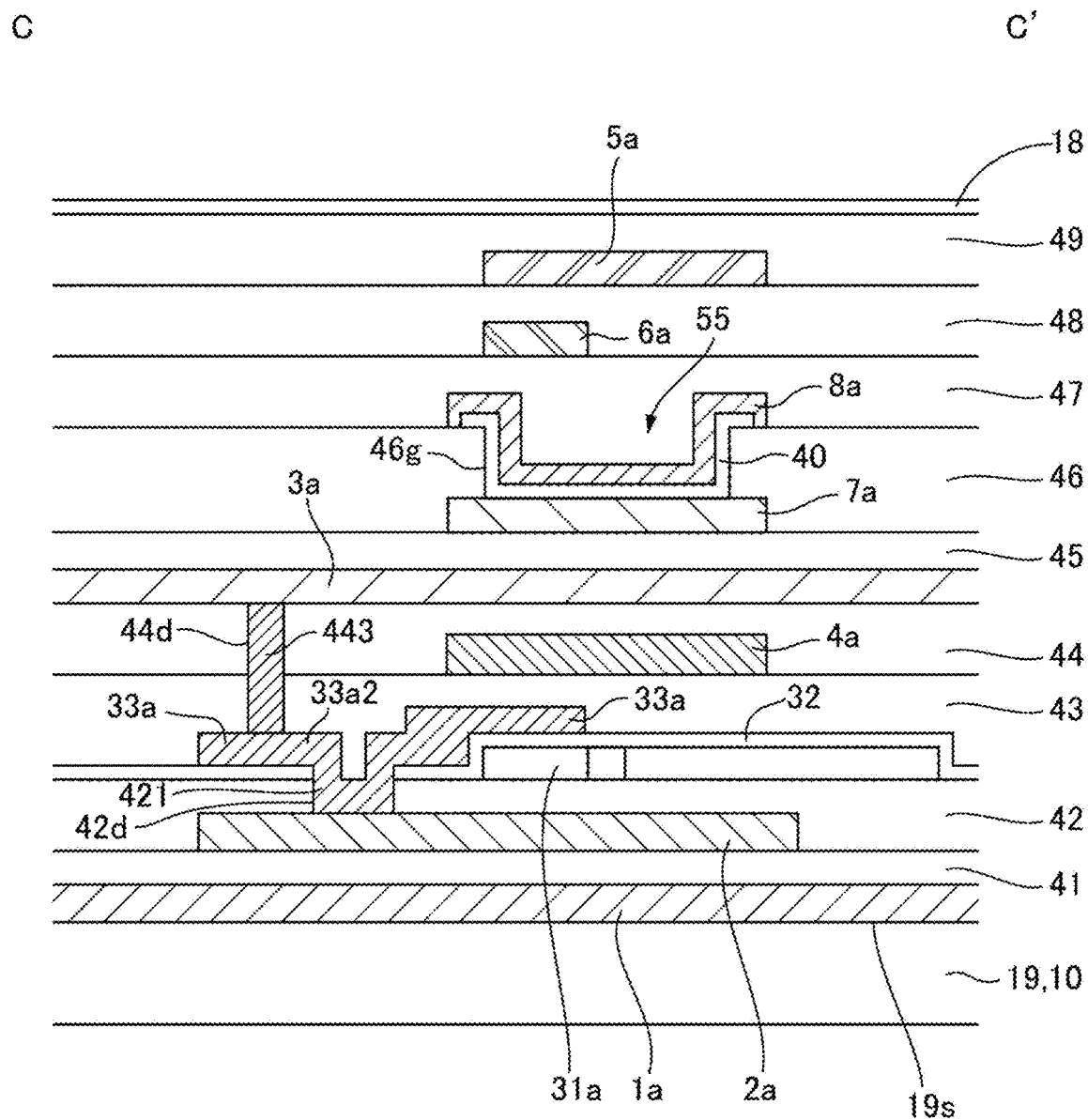
FIG. 8 is a cross-sectional view taken along a line C-C' of the pixel illustrated in FIGS. 4 and 5.

FIG. 4 is a plan view illustrating the plurality of pixels 100a adjacent to each other in the electro-optical device 100 illustrated in FIG. 1. FIG. 5 is an enlarged plan view illustrating one of the pixels 100a illustrated in FIG. 4. FIG. 6 is a cross-sectional view taken along a line A-A' of the pixel 100a illustrated in FIGS. 4 and 5, schematically illustrating a cut view illustrating the pixel 100a along the semiconductor layer 31a. FIG. 7 is a cross-sectional view taken along a line B-B' of the pixel 100a illustrated in FIGS. 4 and 5, schematically illustrating a cut view illustrating the pixel 100a along a plane passing through a first light shielding wall 431 and a second light shielding wall 432. FIG. 8 is a cross-sectional view taken along a line C-C' of the pixel 100a illustrated in FIGS. 4 and 5, schematically illustrating the cut view illustrating the pixel 100a along the scanning line 3a. Note that in FIGS. 4 to 13, scales of the width and the thickness of the lines and the like, are made different to make each of the layers easily recognizable. Also note that in FIGS. 4 and 5, and FIGS. 9 to 13 described below, the layers are represented by the following lines. Further note that in FIGS. 4 and 5, and FIGS. 9 to 13 described below, the positions of end portions of layers, the end portions being overlapped in a plan view with each other, are shifted to make the shape and the like of the layer easily recognizable.

First light shielding layer 1a is indicated by thick chain line.

Second light shielding layer 2a is indicated by thin and long broken line.

Semiconductor layer 31a is indicated by thin and short broken line.

Gate electrode 33a is indicated by thin two-dot chain line.

First conductive layer 4a is indicated by thick and short broken line.

Scanning line 3a and Relay electrodes 3b and 3c are indicated by thick solid lines.

Second conductive layer 7a (First capacitance electrode) and relay electrodes 7b and 7c are indicated by thin solid lines.

Second capacitance electrode 8a and relay electrodes 8b and 8d are indicated by thin chain lines.

Data line 6a and relay electrodes 6c and 6d are indicated by thick and long broken lines.

Capacitance line 5a and relay electrode 5c are indicated by thick two-dot chain lines.

Pixel electrode 9a is indicated by thick solid line.

As illustrated in FIGS. 4 and 5, the pixel electrode 9a is formed in each of the plurality of pixels 100a on the surface of the element substrate 10 facing the counter substrate 20, where a first light shielding layer 1a, the scanning line 3a, the data line 6a, and the capacitance line 5a extend along the inter-pixel region between the pixel electrodes 9a adjacent to each other. The first light shielding layer 1a and the scanning line 3a extend in the first direction X in the inter-pixel region. The data line 6a and the capacitance line 5a extend in the second direction Y in the inter-pixel region. The transistor 30 is formed corresponding to the intersection between the data line 6a and the scanning line 3a. Note that the first light shielding layer 1a, the scanning line 3a, the data line 6a, and the capacitance line 5a have light shielding properties. Accordingly, the first light shielding layer 1a, the scanning line 3a, the data line 6a, the capacitance line 5a, and a region formed in the same layer as these lines serve as the light shielding region 11 through which light does not transmit, and the region surrounded by the light shielding region 11 serves as an aperture region 12 through which light transmits.

As illustrated in FIGS. 6 and 7, in the element substrate 10, interlayer insulating films 41 to 49 are sequentially formed on one surface 19s side of the first substrate 19, where the first light shielding layer 1a is formed between the first substrate 19 and an interlayer insulating film 41, and a second light shielding layer 2a, a semiconductor layer 31a, a gate electrode 33a, a first conductive layer 4a, the scanning line 3a, a second conductive layer 7a, a second capacitance electrode 8a, the data line 6a, and the capacitance line 5a are formed between two respective stacked layers of the interlayer insulating films 41 to 49. The pixel electrode 9a and the first alignment film 18 are sequentially formed on the surface of the interlayer insulating film 49 on the opposite side to the first substrate 19. Accordingly, the scanning line 3a extends in the first direction X between the first substrate 19 and the pixel electrode 9a, the data line 6a extends in the second direction Y intersecting the scanning line 3a between the scanning line 3a and the pixel electrode 9a, and the transistor 30 is provided between the first substrate 19 and the data line 6a, corresponding to the intersection between the scanning line 3a and the data line 6a.

Detailed Description of Each Layer

Figure 9:
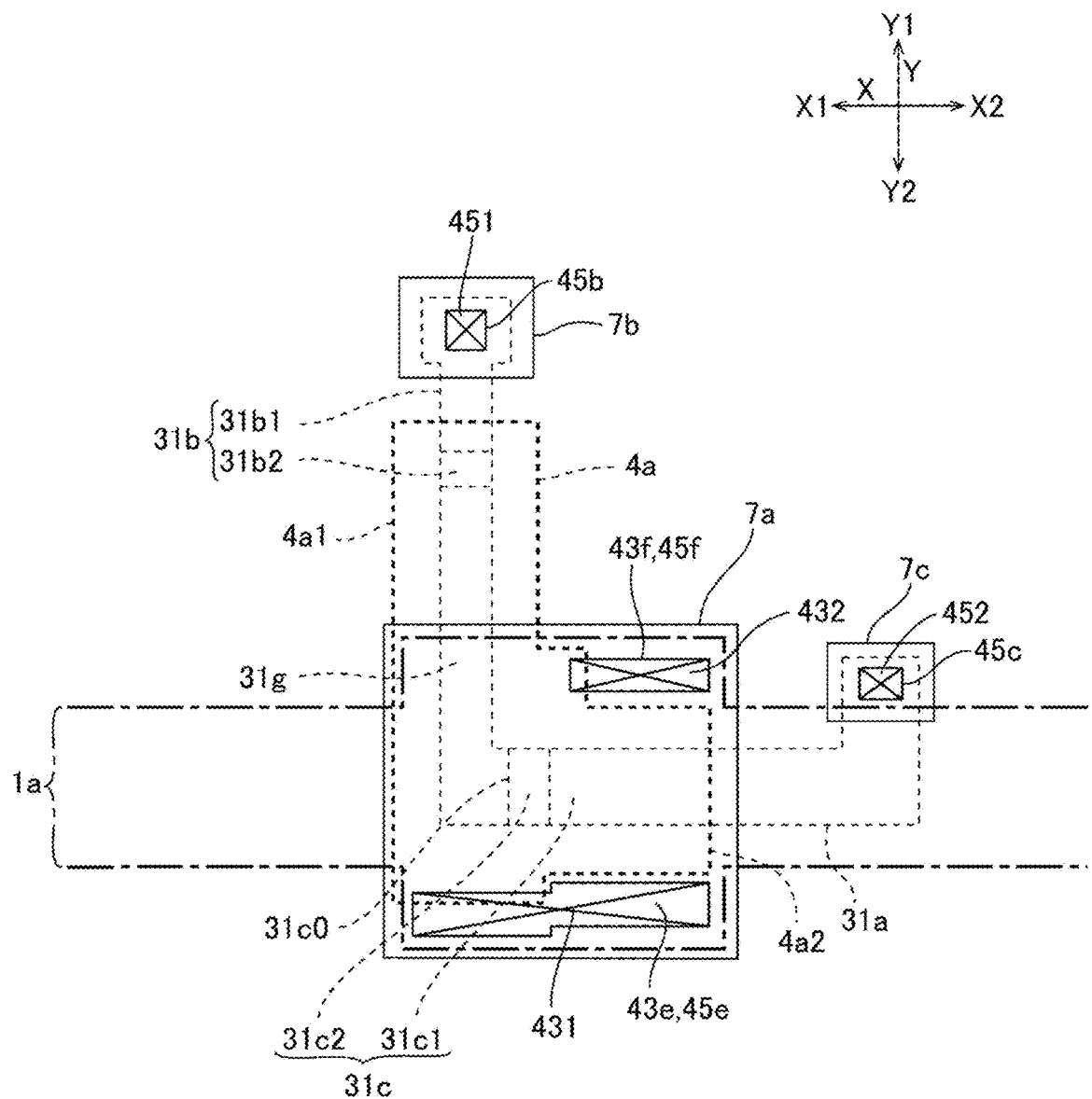
FIG. 9 is a plan view illustrating a first light shielding layer, a first conductive layer, a second conductive layer, and the like illustrated in FIG. 5.
Figure 10:
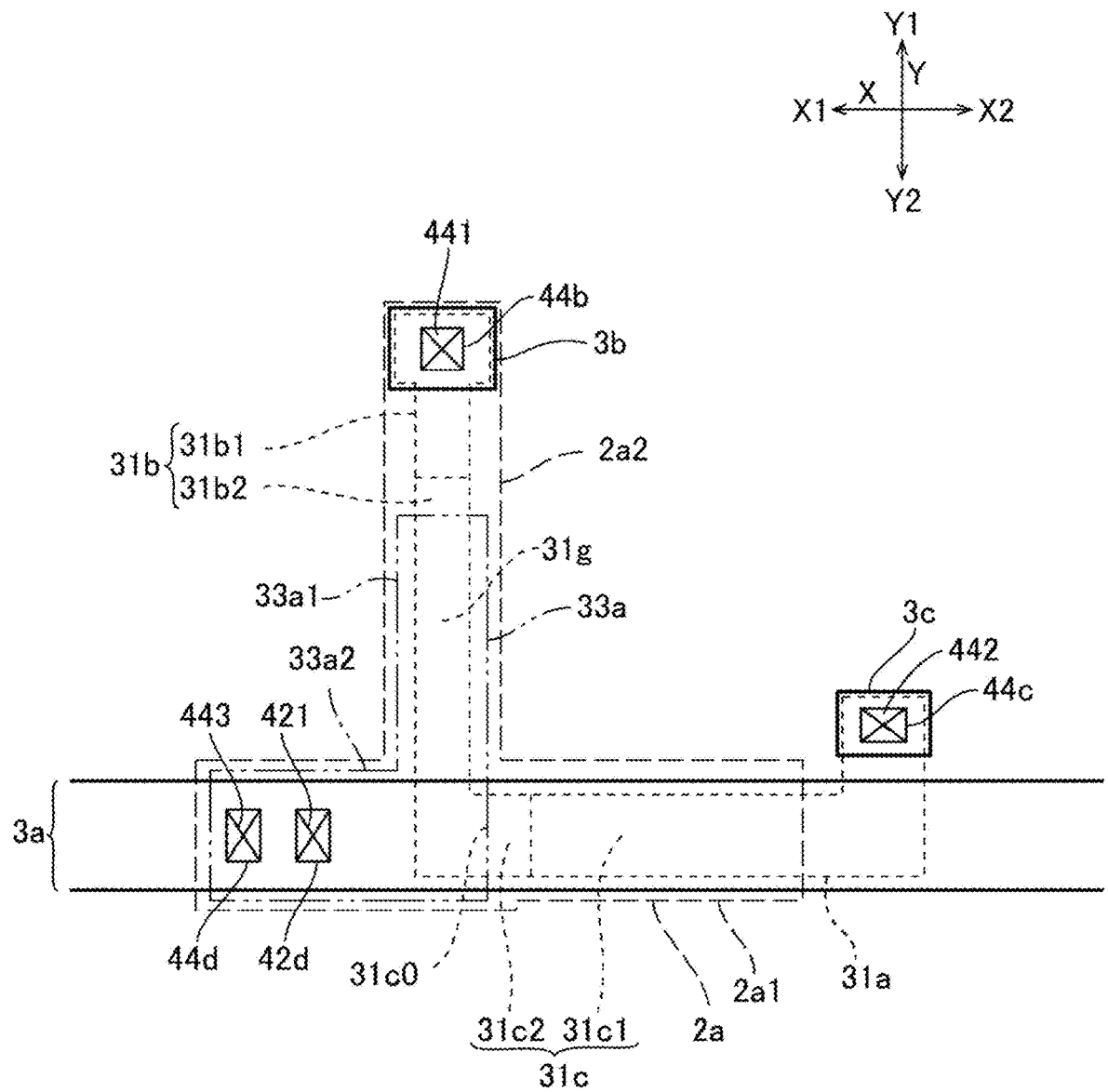
FIG. 10 is a plan view illustrating a second light shielding layer, a gate electrode, a scanning line, and the like illustrated in FIG. 5.
Figure 11:
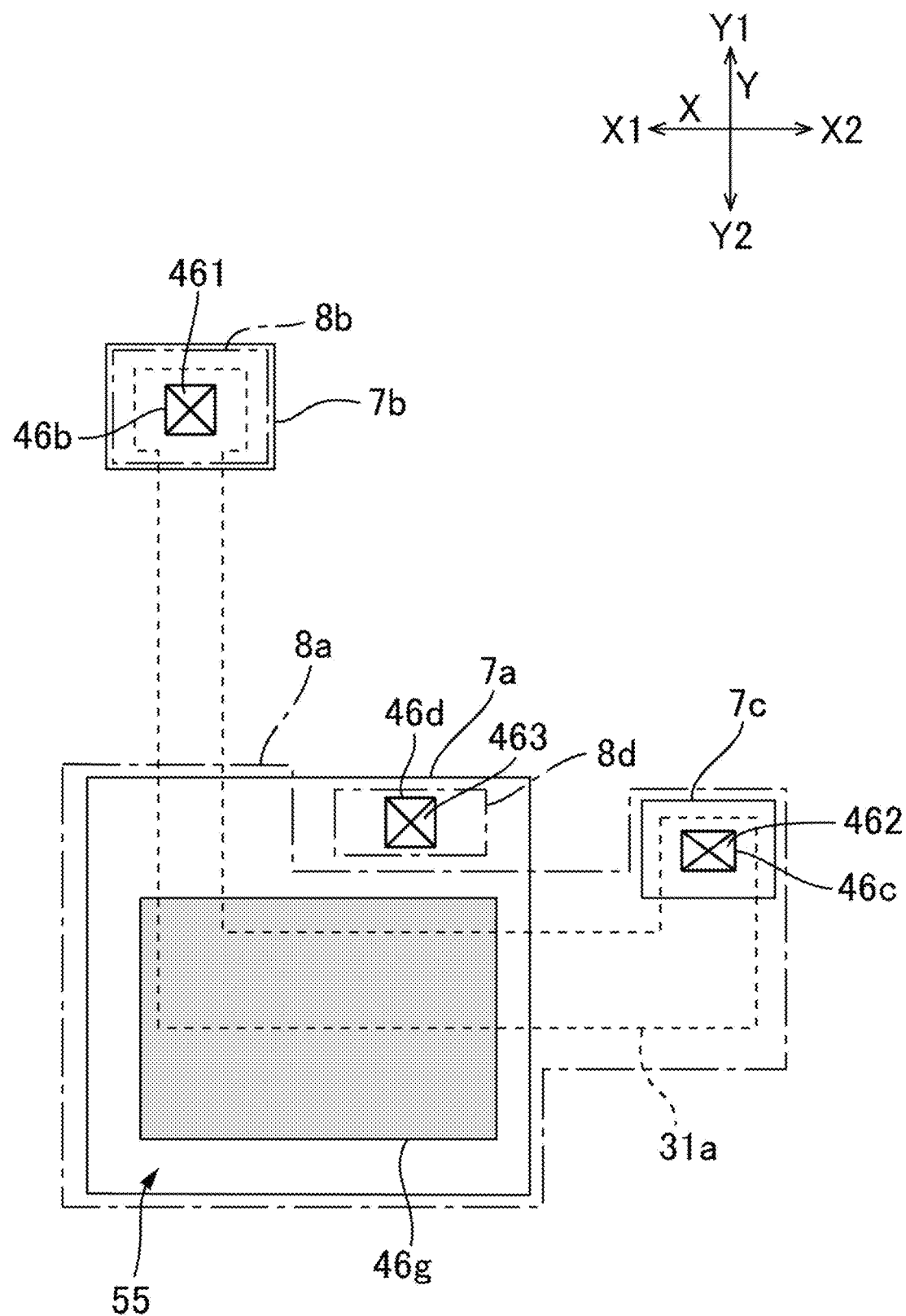
FIG. 11 is a plan view illustrating a holding capacitor and the like illustrated in FIG. 5.
Figure 12:
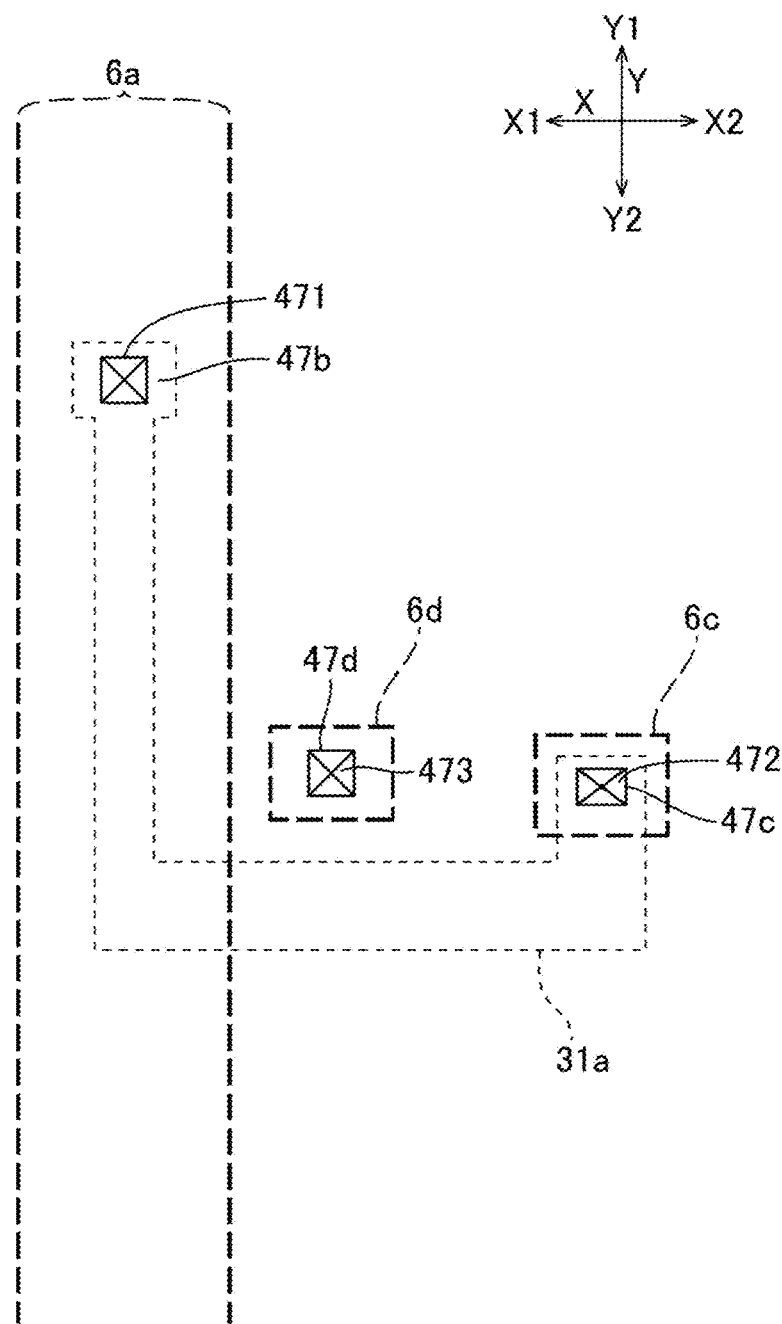
FIG. 12 is a plan view illustrating a data line and the like illustrated in FIG. 5.
Figure 13:
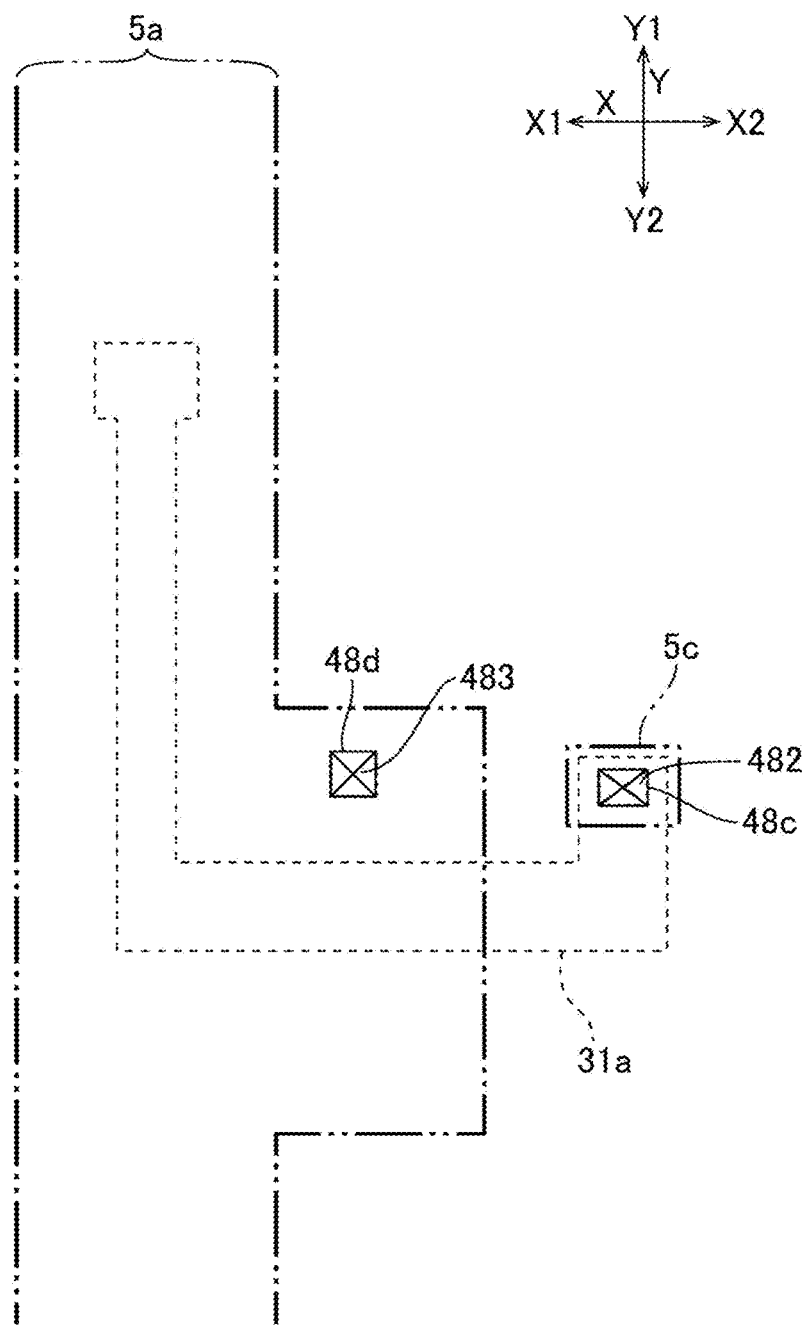
FIG. 13 is a plan view illustrating a capacitance line and the like illustrated in FIG. 5.

With reference to FIGS. 6, 7 and 8, and with reference to FIGS. 9 to 13 as appropriate, a detailed configuration of the element substrate 10 will be described. FIG. 9 is a plan view illustrating the first light shielding layer 1a, the first conductive layer 4a, the second conductive layer 7a, and the like illustrated in FIG. 5. FIG. 10 is a plan view illustrating the second light shielding layer 2a, the gate electrode 33a, the scanning line 3a, and the like illustrated in FIG. 5. FIG. 11 is a plan view illustrating the holding capacitor 55 and the like illustrated in FIG. 5. FIG. 12 is a plan view illustrating the data line 6a and the like illustrated in FIG. 5. FIG. 13 is a plan view illustrating the capacitance line 5a and the like illustrated in FIG. 5. Note that FIGS. 9 to 13 illustrate the contact holes related to the electrical connection of the electrodes and the like illustrated in those drawings, and illustrate the semiconductor layer 31a for indicating the position to be referenced.

First, as illustrated in FIGS. 5 and 9, in the element substrate 10, the first light shielding layer 1a linearly extending in the first direction X is formed, between the first substrate 19 and the interlayer insulating film 41 (between the first substrate 19 and the semiconductor layer 31a), to overlap in a plan view with the scanning line 3a. The first light shielding layer 1a is formed of a conductive film such as a metal silicide film, a metal film, and a metal compound film. In the exemplary embodiment, the first light shielding layer 1a is formed of a light shielding film such as a tungsten silicide (WSi) film, a tungsten film, and a titanium nitride film.

As illustrated in FIGS. 5 and 10, the second light shielding layer 2a is formed between the interlayer insulating film 41 and an interlayer insulating film 42. The second light shielding layer 2a includes a first portion 2a1 extending in the first direction X to overlap in a plan view with the scanning line 3a, and a second portion 2a2 protruding, to overlap with the data line 6a, to one side in the second direction Y from an intermediate portion in the extending direction of the first portion 2a1.

Between the interlayer insulating film 42 and an interlayer insulating film 43 is formed the transistor 30 for pixel switching. In the exemplary embodiment, the transistor 30 includes the semiconductor layer 31a formed on the surface of the interlayer insulating film 42 on the opposite side to the first substrate 19, a gate insulating layer 32 overlaid on the pixel electrode 9a side of the semiconductor layer 31a, and the gate electrode 33a overlapping in a plan view with a semiconductor layer 31aa on the pixel electrode 9a side of the gate insulating layer 32.

The semiconductor layer 31aa bends to overlap with both the scanning line 3a and the data line 6a and to form an L shape extending in the first direction X and the second direction Y, in which a bending portion overlapping in a plan view with the gate electrode 33a serves as a channel region 31g. The gate electrode 33a includes a first electrode portion 33a1 extending in the second direction Y to overlap in a plan view with the semiconductor layer 31a, where the first electrode portion 33a1 overlaps in a plan view with the semiconductor layer 31a. Accordingly, the semiconductor layer 31a includes a first source/drain region 31b extending in the second direction Y to overlap in a plan view with the data line 6a and electrically coupled to the data line 6a, a second source/drain region 31c extending in the first direction X to overlap in a plan view with the scanning line 3a and electrically coupled to the pixel electrode 9a, and the channel region 31g coupling the first source/drain region 31b to the second source/drain region 31c.

In the exemplary embodiment, the transistor 30 includes an LDD structure. Accordingly, each of the first source/drain region 31b and the second source/drain region 31c includes first regions 31b1 and 31c1 in which a high concentration impurity is introduced at a position away from the channel region 31g, and second regions 31b2 and 31c2 having impurity concentration lower than the first regions 31b1 and 31c1 between the channel region 31g and the first regions 31b1 and 31c1. Thus, the boundary portion between the second source/drain region 31c and the channel region 31g in the semiconductor layer 31a is a semiconductor layer portion 31c0 in the semiconductor layer 31a, which overlaps with the end portion of the gate electrode 33a on the second source/drain region 31c side via the gate insulating layer 32.

The semiconductor layer 31a is formed of a polysilicon film (polycrystalline silicon film) or the like, where the gate insulating layer 32 includes a two-layer structure of a first gate insulating layer formed of a silicon oxide film formed by thermal oxidization of the semiconductor layer 31a, and a second gate insulating layer formed of a silicon oxide film formed by a low-pressure CVD method or the like. The gate electrode 33a is formed of a conductive film such as a conductive polysilicon film, a metal silicide film, a metal film, and a metal compound film. In the exemplary embodiment, the gate electrode 33a is formed of a conductive polysilicon film. The gate electrode 33a includes a second electrode portion 33a2 protruding from the first electrode portion 33a1 toward the opposite side to one side X2 (the second source/drain region 31c) in the first direction X, where the second electrode portion 33a2 overlaps in a plan view with the scanning line 3a and the second light shielding layer 2a.

Turning back to FIGS. 5 and 9, the first conductive layer 4a is formed between the gate electrode 33a and the pixel electrode 9a (between the interlayer insulating film 43 and an interlayer insulating film 44). The first conductive layer 4a is formed of a conductive film such as a metal silicide film, a metal film, and a metal compound film. In the exemplary embodiment, the first conductive layer 4a is formed of a light shielding film such as a tungsten silicide (WSi) film, a tungsten film, and a titanium nitride film. In the exemplary embodiment, the first conductive layer 4a includes a main body portion 4a1 overlapping in a plan view with the data line 6a and a protruding portion 4a2 protruding from the main body portion 4a1 to overlap with the second source/drain region 31c, overlapping in a plan view with the channel region 31g and the second region 31c2 of the second source/drain region 31c.

Turning back to FIGS. 5 and 10, the scanning line 3a is provided between the gate electrode 33a and the pixel electrode 9a (between the interlayer insulating film 44 and an interlayer insulating film 45). The gate electrode 33a is electrically coupled, on the opposite side to the second source/drain region 31c, to the scanning line 3a via a fourth contact hole 44d penetrating through the third interlayer insulating film (the interlayer insulating films 43 and 44) that is interposed between the second electrode portion 33a2 of the gate electrode 33a and the scanning line 3a. In the exemplary embodiment, the inner space of the fourth contact hole 44d is filled with a plug 443 formed of a metal film such as tungsten, where the gate electrode 33a is electrically coupled to the scanning line 3a via the plug 443. Between the interlayer insulating film 44 and the interlayer insulating film 45 are formed relay electrodes 3b and 3c that are formed simultaneously with the scanning lines 3a. The relay electrode 3b is electrically coupled, as a source electrode, to the first region 31b1 of the first source/drain region 31b via a contact hole 44b penetrating through the interlayer insulating films 43 and 44. The relay electrode 3c is electrically coupled, as a drain electrode, to the first region 31c1 of the second source/drain region 31c via a contact hole 44c penetrating through the interlayer insulating films 43 and 44. The inner spaces of the contact holes 44b and 44c are filled with plugs 441 and 442 formed of a metal film such as tungsten, where the relay electrodes 3b and 3c are electrically coupled to the first regions 31b1 and 31c1 via the plugs 441 and 442, respectively. Accordingly, the surface of the interlayer insulating film 44 is formed, by chemical mechanical polishing (CMP) or the like, to be a plane continuous with the surfaces of the plugs 441, 442, and 443.

Turning back to FIGS. 5 and 9, the second conductive layer 7a is provided between the first conductive layer 4a and the pixel electrode 9a (between the interlayer insulating film 45 and the interlayer insulating film 46). The second conductive layer 7a is formed of a conductive film such as a conductive polysilicon film, a metal silicide film, a metal film, and a metal compound film. In the exemplary embodiment, the second conductive layer 7a includes, for example, a multilayer structure of Ti (titanium) layer/TiN (titanium nitride) layer/Al (aluminum) layer/TiN (titanium nitride) layer or a multilayer structure of TiN layer/Al layer/TiN layer. Relay electrodes 7b and 7c formed simultaneously with the second conductive layer 7a are provided between the interlayer insulating film 45 and an interlayer insulating film 46. The relay electrodes 7b and 7c are electrically coupled to the relay electrodes 3b and 3c via contact holes 45b and 45c penetrating through the interlayer insulating film 45, respectively. The inner spaces of the contact holes 45b and 45c are filled with plugs 451 and 452 formed of a metal film such as tungsten, where the relay electrodes 7b and 7c are electrically coupled to the relay electrodes 3b and 3c via the plugs 451 and 452, respectively. Accordingly, the surface of the interlayer insulating film 45 is formed, by chemical mechanical polishing or the like, to be a plane continuous with the surfaces of the plugs 451 and 452.

As illustrated in FIGS. 5 and 11, the second conductive layer 7a serves as a first capacitance electrode constituting the second capacitance electrode 8a and the holding capacitor 55 formed between the second conductive layer 7a and the pixel electrode 9a (between the interlayer insulating film 45 and the interlayer insulating film 46). More specifically, a through hole 46g reaching the second conductive layer 7a is formed through the interlayer insulating film 46, where a dielectric layer 40 and the second capacitance electrode 8a formed on the surface of the interlayer insulating film 46 overlap with the second conductive layer 7a (the first capacitance electrode) at the bottom of the through hole 46g. The second capacitance electrode 8a is formed of a conductive film such as a conductive polysilicon film, a metal silicide film, a metal film, and a metal compound film. In the exemplary embodiment, the second capacitance electrode 8a includes, for example, a multilayer structure of Ti (titanium) layer/TiN (titanium nitride) layer/Al (aluminum) layer/TiN (titanium nitride) layer or a multilayer structure of TiN layer/Al layer/TiN layer. It is herein noted that the second conductive layer 7a is electrically coupled to the capacitance line 5a described below, to which a common potential is applied. On the contrary, the second capacitance electrode 8a is electrically coupled to the pixel electrode 9a and the second source/drain region 31c. Hence, the second capacitance electrode 8a is electrically coupled to the relay electrode 7c via a contact hole 46c penetrating through the interlayer insulating film 46.

Relay electrodes 8b and 8d formed simultaneously with the second capacitance electrode 8a are provided between the interlayer insulating film 45 and the interlayer insulating film 46. The relay electrodes 8b and 8d are electrically coupled to the relay electrode 7b and the second conductive layer 7a via contact holes 46b and 46d penetrating through the interlayer insulating film 46, respectively. The inner spaces of the contact holes 46b, 46c, and 46d are filled with plugs 461, 462, and 463 formed of a metal film such as tungsten, respectively, where the second capacitance electrode 8a and the relay electrodes 8b and 8d are electrically coupled to the relay electrodes 7c and 7b and the second conductive layer 7a via the plugs 461, 462, and 463, respectively. Accordingly, the surface of the interlayer insulating film 46 is formed to be a plane continuous with the surfaces of the plugs 461, 462, and 463.

As illustrated in FIGS. 5 and 12, the data line 6a extending in the second direction Y is formed between an interlayer insulating film 47 and an interlayer insulating film 48. The data line 6a is formed of a conductive film such as a conductive polysilicon film, a metal silicide film, a metal film, and a metal compound film. In the exemplary embodiment, the data line 6a includes, for example, a multilayer structure of Ti (titanium) layer/TiN (titanium nitride) layer/Al (aluminum) layer/TiN (titanium nitride) layer or a multilayer structure of TiN layer/Al layer/TiN layer. The data line 6a is electrically coupled to the relay electrode 8b via a contact hole 47b formed through the interlayer insulating film 47 that is interposed between the data line 6a and the relay electrode 8b.

Between the interlayer insulating film 47 and the interlayer insulating film 48 are formed relay electrodes 6c and 6d that are formed simultaneously with the data line 6a, where the relay electrodes 6c and 6d are electrically coupled to the second capacitance electrode 8a and the relay electrode 8d via contact holes 47c and 47d penetrating through the interlayer insulating film 47, respectively. The inner spaces of the contact holes 47b, 47c, and 47d are filled with plugs 471, 472, and 473 formed of a metal film such as tungsten, respectively, where the data line 6a and the relay electrodes 6c and 6d are electrically coupled to the relay electrode 8b, the second capacitance electrode 8a, and the relay electrode 8d via the plugs 471, 472, and 473, respectively. Accordingly, the surface of the interlayer insulating film 47 is formed to be a plane continuous with the surfaces of the plugs 471, 472, and 473.

Between the interlayer insulating film 48 and the interlayer insulating film 49 is formed the capacitance line 5a extending in the second direction Y, where a common potential is applied to the capacitance line 5a. The capacitance line 5a is formed of a conductive film such as a conductive polysilicon film, a metal silicide film, a metal film, and a metal compound film. In the exemplary embodiment, the capacitance line 5a includes, for example, a multilayer structure of Ti (titanium) layer/TiN (titanium nitride) layer/Al (aluminum) layer/TiN (titanium nitride) layer or a multilayer structure of TiN layer/Al layer/TiN layer. The capacitance line 5a is electrically coupled to the relay electrode 6d via a contact hole 48d formed through the interlayer insulating film 48 that is interposed between the capacitance line 5a and the relay electrode 6d. Accordingly, the capacitance line 5a is electrically coupled to the second conductive layer 7a (first capacitance electrode), and applies a common potential to the second conductive layer 7a.

Between the interlayer insulating film 48 and the interlayer insulating film 49 is formed a relay electrode 5c formed simultaneously with the capacitance line 5a, where each of the relay electrodes 5c is electrically coupled to the relay electrode 6c via a contact hole 48c penetrating through the interlayer insulating film 48. The inner spaces of the contact holes 48c and 48d are filled with plugs 482 and 483 formed of a metal film such as tungsten, where the relay electrode 5c and the capacitance line 5a are electrically coupled to the relay electrodes 6c and 6d via the plugs 482 and 483, respectively. Accordingly, the surface of the interlayer insulating film 48 is formed to be a plane continuous with the surfaces of the plugs 482 and 483.

On the surface of the interlayer insulating film, the pixel electrode 9a and the first alignment film 18 are sequentially layered. The pixel electrode 9a is electrically coupled to the relay electrode 5c via a contact hole 49c formed through the interlayer insulating film 49 that is interposed between the pixel electrode 9a and the relay electrode 5c. Accordingly, the pixel electrode 9a is electrically coupled to the second capacitance electrode 8a and the first region 31c1 of the second source/drain region 31c. The inner space of the contact hole 49c is filled with a plug 492 formed of a metal film such as tungsten, where the pixel electrode 9a is electrically coupled to the relay electrode 5c via the plug 492. Accordingly, the surface of the interlayer insulating film 49 is formed to be a plane continuous with the surface of the plug 492.

Configuration of Light Shielding Wall

As illustrated in FIGS. 5, 7 and 9, in the element substrate 10, the first light shielding layer 1a is electrically coupled to the first conductive layer 4a via a first contact hole 43e and a second contact hole 43f provided along the semiconductor layer 31a on the first interlayer insulating film (the interlayer insulating films 41, 42, and 43) that is interposed between the first light shielding layer 1a and the first conductive layer 4a. At least the second source/drain region 31c in the semiconductor layer 31a extends, when viewed from the first direction X or the second direction Y, between the first contact hole 43e and the second contact hole 43f. In the exemplary embodiment, at least the second source/drain region 31c in the semiconductor layer 31a extends, when viewed from the first direction X, between the first contact hole 43e and the second contact hole 43f. At least the semiconductor layer portion 31c0 in the semiconductor layer 31a, which overlaps with the end portion on the second source/drain region 31c side of the gate electrode 33a via the gate insulating layer 32, is located between the first contact hole 43e and the second contact hole 43f.

Accordingly, at a position opposed to the semiconductor layer portion 31c0 on the opposite side to the first source/drain region 31b is formed the first contact hole 43e penetrating through the first interlayer insulating film (the interlayer insulating films 41, 42, and 43) that is interposed between the first light shielding layer 1a and the first conductive layer 4a, and on the opposite side to the first contact hole 43e with the semiconductor layer portion 31c0 interposed in between is formed the second contact hole 43f penetrating through the first interlayer insulating film (the interlayer insulating films 41, 42, and 43).

It is herein noted that a light shielding conductive material is formed on the inner side of the first contact hole 43e to cover the inner wall of the first contact hole 43e, where the first light shielding wall 431 is formed of such a conductive material. A light shielding conductive material is also formed on the inner side of the second contact hole 43f to cover the inner wall of the second contact hole 43f, where the second light shielding wall 432 is formed of such a conductive material. Accordingly, the first light shielding layer 1a is electrically coupled to the first conductive layer 4a via the interior portions of the first contact hole 43e and the second contact hole 43f formed on both sides of the semiconductor layer portion 31c0. That is, the first light shielding layer 1a is electrically coupled to the first conductive layer 4a via the first light shielding wall 431 and the second light shielding wall 432 formed on both sides of the semiconductor layer portion 31c0. The first light shielding wall 431 and the second light shielding wall 432 are formed of a conductive film such as a metal silicide film, a metal film, and a metal compound film. In the exemplary embodiment, the first light shielding wall 431 and the second light shielding wall 432 are formed of tungsten. The tungsten is in a state of embedding into the first contact hole 43e and the second contact hole 43f. The first light shielding wall 431 and the second light shielding wall 432 serve as the first plug and the second plug each formed of tungsten, respectively.

It is herein noted that the first contact hole 43e (the first light shielding wall 431) and the second contact hole 43f (the second light shielding wall 432) extend in the first direction X along the semiconductor layer 31a, where the second region 31c2 of the second source/drain region 31c is entirely located between the first light shielding wall 431 and the second light shielding wall 432.

In the exemplary embodiment, between the first conductive layer 4a and the pixel electrode 9a is formed a fifth contact hole 45e penetrating through the fourth interlayer insulating film (the interlayer insulating films 44 and 45) to partially communicate with the first contact hole 43e, where the fourth interlayer insulating film is interposed between the first conductive layer 4a and the second conductive layer 7a, and the first light shielding wall 431 is integrally provided from the fifth contact hole 45e to the first contact hole 43e. In the fourth interlayer insulating film (the interlayer insulating films 44 and 45) that is interposed between the first conductive layer 4a and the second conductive layer 7a, a sixth contact hole 45f partially communicating with the second contact hole 43f is formed, where the second light shielding wall 432 is integrally provided from the sixth contact hole 45f to the second contact hole 43f. Hence, the first conductive layer 4a can be electrically coupled to the second conductive layer 7a by means of the first light shielding wall 431 and the second light shielding wall 432, where a common potential can be applied to the first light shielding wall 431 and the second light shielding wall 432.

In the exemplary embodiment, between the first light shielding layer 1a and the semiconductor layer 31a is formed the second light shielding layer 2a overlapping in a plan view with the semiconductor layer 31a, where a third contact hole 42d penetrating through the interlayer insulating film 42 (the second interlayer insulating film) is formed on the opposite side of the semiconductor layer portion 31c0 to the second source/drain region 31c in the region overlapping in a plan view with the scanning line 3a and the gate insulating layer 32 that are interposed between the second light shielding layer 2a and the second electrode portion 33a2 of the gate electrode 33a. A third light shielding wall 421 is provided by the conductive material formed to cover the inner wall of the third contact hole 42d. Accordingly, the third light shielding wall 421 is electrically coupled to the gate electrode 33a. In the exemplary embodiment, the third light shielding wall 421 is a portion formed on the inner side of the third contact hole 42d in the second electrode portion 33a2 of the gate electrode 33a.

Main Effects of the Exemplary Embodiment

As described above, in the electro-optical device 100 of the exemplary embodiment, the semiconductor layer 31a of the transistor 30, which bends to overlap with both the scanning line 3a and the data line 6a, has an L shape extending in the first direction X and in the second direction Y. A sufficient length of the semiconductor layer 31a can be ensured even when reducing the size of the semiconductor layer 31a in the first direction X and in the second direction Y, thereby maintaining an appropriate channel length. This allows addressing a reduction in array pitch and the like of the pixels 100a.

The first light shielding layer 1a overlaps with the first substrate 19 side of the semiconductor layer 31a. In particular, in the exemplary embodiment, the first light shielding layer 1a extends in the first direction X to overlap in a plan view with the scanning line 3a. Accordingly, light emitted from the first substrate 19 side and reflected to be incident on the first substrate 19 again can be prevented from entering the semiconductor layer 31a. This inhibits an occurrence of optical leakage current.

The first contact hole 43e and the second contact hole 43f provided on both sides of the semiconductor layer portion 31c0 between the channel region 31g and the second source/drain region 31c of the semiconductor layer 31a can also prevent light such as oblique light and diffracted light from entering the semiconductor layer portion 31c0. This inhibits an occurrence of optical leakage current. Moreover, the first light shielding wall 431 and the second light shielding wall 432 provided in the first contact hole 43e and the second contact hole 43f more effectively prevent light such as oblique light or diffracted light from entering the semiconductor layer portion 31c0. This inhibits an occurrence of optical leakage current in a more effective manner. It is herein noted that a constant potential is applied to the conductive material (the first light shielding wall 431 and the second light shielding wall 432) formed on the inner side of the first contact hole 43e and the second contact hole 43f. In particular, in the exemplary embodiment, a common potential is applied to the first light shielding wall 431 and the second light shielding wall 432. This prevents, even when the first light shielding wall 431 and the second light shielding wall 432 come close to the semiconductor layer portion 31c0, the first light shielding wall 431 and the second light shielding wall 432 from electrically affecting the semiconductor layer portion 31c0. Accordingly, the first light shielding wall 431 and the second light shielding wall 432 can be brought close to the semiconductor layer portion 31c0, preventing the first light shielding wall 431 and the second light shielding wall 432 from bulging too much. Thus, the formation of the first light shielding wall 431 and the second light shielding wall 432 can suppress the aperture region 12 of the pixel 100a from being narrowed.

The first light shielding wall 431 and the second light shielding wall 432 each extend in the first direction X along the semiconductor layer 31a, where the second region 31c2 (LDD region) of the second source/drain region 31c is entirely located between the first light shielding wall 431 and the second light shielding wall 432. This prevents light from entering the second region 31c2, which further inhibits an occurrence of optical leakage current. Each of the first light shielding wall 431 and the second light shielding wall 432 serves as a first plug for filling the first contact hole 43e, where the second light shielding wall 432 serves as a second plug for filling the second contact hole 43f. This allows the first light shielding wall 431 and the second light shielding wall 432 to be formed of materials having high light shielding properties regardless of the material and the like constituting the first conductive layer, which enhances light shielding properties of the first light shielding wall 431 and the second light shielding wall 432.

The first conductive layer 4a having a light shielding property prevents light from entering the semiconductor layer portion 31c0 from the pixel electrode 9a side. This further inhibits an occurrence of optical leakage current. The third light shielding wall 421 (the third contact hole 42d) is provided on the opposite side of the semiconductor layer portion 31c0 to the second source/drain region 31c. This allows the third light shielding wall 421 to prevent light from entering the semiconductor layer portion 31c0 and the like from a side on which neither the first light shielding wall 431 nor the second light shielding wall 432 is formed. This further inhibits an occurrence of optical leakage current. The third light shielding wall 421 (the third contact hole 42d) is provided at a position overlapping in a plan view with the second electrode portion 33a2 protruding, in the gate electrode 33a, toward the opposite side to the second source/drain region 31c. The third light shielding wall 421 overlapping in a plan view with the scanning line 3a suppresses the aperture region 12 of the pixel 100a from being narrowed regardless of the provision of the third light shielding wall 421.

The scanning line 3a provided between the gate electrode 33a and the pixel electrode 9a does not impede the first light shielding wall 431 and the second light shielding wall 432 from being formed unlike the case where the scanning line 3a is provided between the first light shielding layer 1a and the semiconductor layer 31a.

Other Exemplary Embodiments

In the above exemplary embodiment, although a plug is used for connecting the relay electrodes, an aspect may be employed, in which the electrode on the upper layer side is partially in contact with the electrode on the lower layer side at the bottom portion of the contact hole. In the above exemplary embodiment, although description is given in which the transistor 30 has the LDD structure, the invention may also be applied in the case of an offset gate structure in which the first source/drain region 31b and the second source/drain region 31c are located apart from the end portion of the gate electrode 33a. In the above exemplary embodiment, although description is given in which light source light is incident from the counter substrate 20, the invention may also be applied in the case where the light source light is incident from the element substrate 10. In the above exemplary embodiment, although the invention is applied to the transmissive electro-optical device 100, the invention may also be applied to a reflective electro-optical device.

Installation Example to Electronic Apparatus

Figure 14:
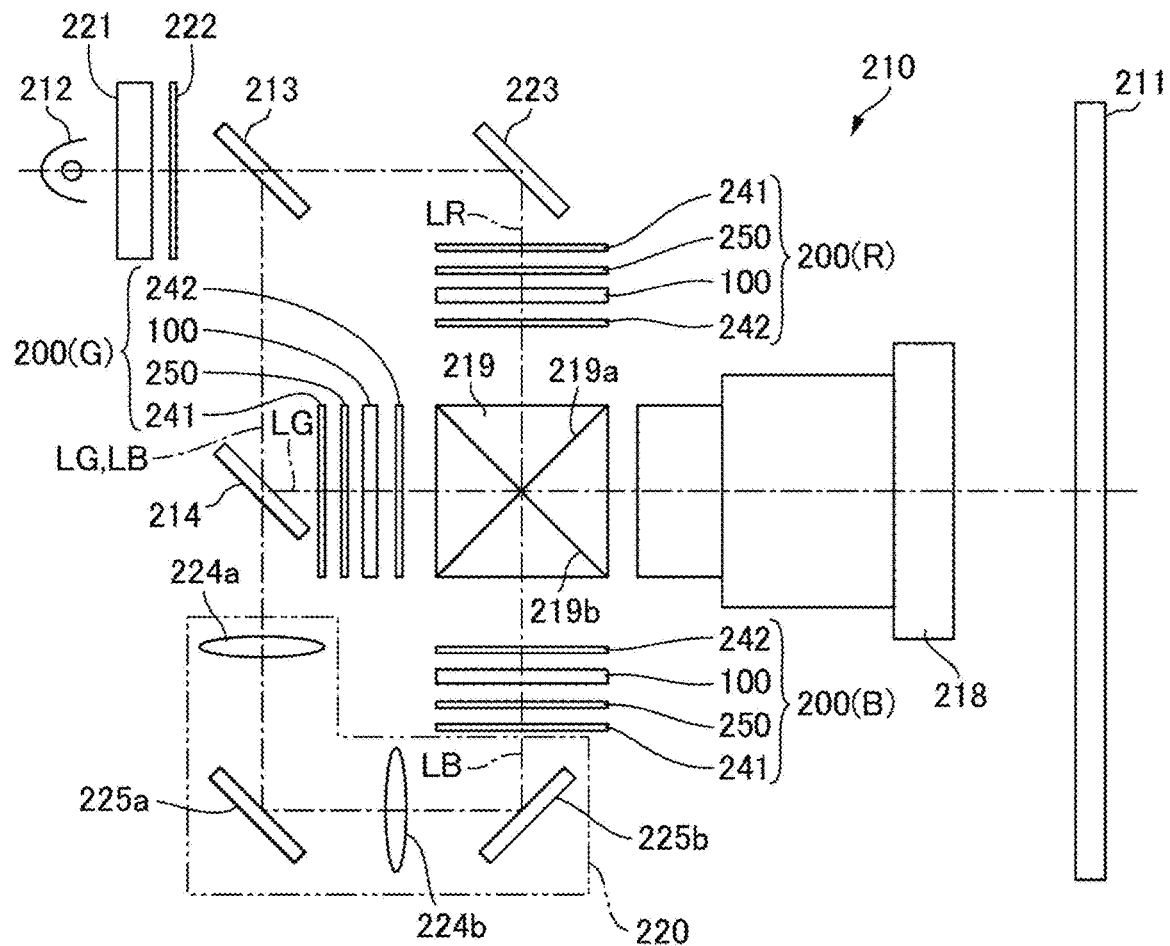
FIG. 14 is a schematic configuration diagram of a projection-type display device (electronic apparatus) using an electro-optical device to which the invention is applied.

FIG. 14 is a schematic configuration diagram of a projection-type display device (electronic apparatus) using the electro-optical device 100 to which the invention is applied. Note that in the descriptions below, although a plurality of optical modulators 200 (R), (G), and (B) are used to which light in mutually different wavelength regions are supplied, the electro-optical device 100 to which the invention is applied is used in any of the optical modulators 200 (R), (G), and (B). A projection-type display device 210 illustrated in FIG. 14 serves as a projection-type projector configured to project an image on a screen 211 provided anteriorly. The projection-type display device 210 includes a light source 212, dichroic mirrors 213 and 214, optical modulators 200 (R), (G), and (B), a projection optical system 218, a cross dichroic prism 219, and a relay system 220. Each of the optical modulators 200 (R), (G), and (B), which is the optical modulator 200 described with reference to FIG. 2 and the like, includes, along the traveling direction of the light L, a first polarizing element 241, an optical compensation element 250, the electro-optical device 100, and a second deflection element 242.

The light source 212 is configured by an extra-high-pressure mercury lamp for supplying light including red light, green light, and blue light, for example. The dichroic mirror 213 is configured to be transmissive of red light LR from the light source 212 and reflective of green light LG and blue light LB. The dichroic mirror 214 is configured to be transmissive of blue light LB and reflective of green light LG in the green light LG and the blue light LB reflected by the dichroic mirror 213. In this way, the dichroic mirrors 213 and 214 constitute a color separation optical system configured to separate light emitted from the light source 212 into red light LR, green light LG, and blue light LB. An integrator 221 and a polarization conversion element 222 are sequentially arranged, between the dichroic mirror 213 and the light source 212, from the light source 212. The integrator 221 equalizes the illuminance distribution of the light irradiated from the light source 212. The polarization conversion element 222 converts the light from the light source 212 into polarized light having a specific vibration direction such as s-polarized light.

The optical modulator 200 (R) modulates the red light LR transmitted through the dichroic mirror 213 and reflected by a reflection mirror 223 in accordance with image signals. The red light LR incident on the optical modulator 200 (R) and then transmitted through the first polarizing element 241 is converted into, for example, s-polarized light. The liquid crystal panel 100p converts, by modulation in accordance with image signals, the incident s-polarized light into p-polarized light (circularly polarized light or elliptically polarized light in the case of halftone). Moreover, the second deflecting element 242 blocks s-polarized light and transmits p-polarized light. Accordingly, the optical modulator 200 (R) modulates the red light LR in accordance with image signals and then emits the modulated red light LR toward the cross dichroic prism 219.

The optical modulator 200 (G) modulates, in accordance with image signals, the green light LG reflected by the dichroic mirror 213 and then reflected by the dichroic mirror 214. The optical modulator 200 (G) emits the modulated green light LG toward the cross dichroic prism 219.

The optical modulator 200 (B) modulates, in accordance with image signals, the blue light LB reflected by the dichroic mirror 213, transmitted through the dichroic mirror 214, and then passed through the relay system 220. The optical modulator 200 (B) emits the modulated blue light LB toward the cross dichroic prism 219.

The relay system 220 includes relay lenses 224a and 224b and reflection mirrors 225a and 225b. The relay lenses 224a and 224b are provided to prevent the loss of light due to the long optical path of the blue light LB. The relay lens 224a is disposed between the dichroic mirror 214 and the reflection mirror 225a.

The relay lens 224b is disposed between the reflection mirrors 225a and 225b. The reflection mirror 225a is disposed to reflect, toward the relay lens 224b, the blue light LB transmitted through the dichroic mirror 214 and then emitted from the relay lens 224a. The reflection mirror 225b is disposed to reflect the blue light LB emitted from the relay lens 224b toward the optical modulator 200 (B).

The cross dichroic prism 219 serves as a color combining optical system in which two dichroic films 219a and 219b are orthogonally arranged in an X shape. The dichroic film 219a reflects the blue light LB and transmits the green light LG. The dichroic film 219b reflects the red light LR and transmits the green light LG.

Accordingly, the cross dichroic prism 219 is configured to synthesize the red light LR, the green light LG, and the blue light LB modulated by the optical modulators 200 (R), (G), and (B) respectively and to emit the synthesized light toward the projection optical system 218. The projection optical system 218, which includes a projection lens (not illustrated), is configured to project the light synthesized by the cross dichroic prism 219 onto the screen 211.

Note that such a configuration may also be employed where a λ/2 phase difference compensation element is provided for the optical modulators 200 (R) and (B) for red and blue light, in which the light incident on the cross dichroic prism 219 from the optical modulators 200 (R) and (B) is modulated into s-polarized light, and where the optical modulator 200 (G) is configured without a λ/2 phase difference compensation element, in which the light incident on the cross dichroic prism 219 from the optical modulator 200 (G) is modulated into p-polarized light.

A color synthesizing optical system can be configured to be optimized in view of the reflection characteristics of the dichroic films 219a and 219b by modulating the light incident on the cross dichroic prism 219 into different types of polarized light. The red light LR and the blue light LB reflected by the dichroic films 219a and 219b as described above may be modulated into s-polarized light, and the green light LG that transmits the dichroic films 219a and 219b may be modulated into p-polarized light, taking advantage of the dichroic films 219a and 219b normally having excellent reflection characteristics for s-polarized light.

Other Projection-Type Display Devices

In the projection-type display device, an LED light source, a laser light source, or the like for emitting light of each color may be used as the light source unit, and each of the colored lights emitted from the light source may be supplied to a separate liquid crystal device.

The electro-optical device 100 to which the invention is applied may be used for a variety of electronic apparatuses such as a projection-type head-up display (HUD) and a direct viewing-type head-mounted display (HMD) in addition to the above electronic apparatuses. The electro-optical device 100 to which the invention is applied may also be used for electronic apparatuses such as a personal computer, a digital still camera, a liquid crystal television, and the like.

The entire disclosure of Japanese Patent Application No. 2017-250706, filed Dec. 27, 2017 is expressly incorporated by reference herein.

What is claimed is:

1. An electro-optical device comprising:
a first substrate;
a pixel electrode provided on one surface side of the first substrate;
a scanning line provided in a layer between the first substrate and the pixel electrode, the scanning line extending in a first direction;
a data line provided in a layer between the first substrate and the pixel electrode, the data line extending in a second direction intersecting the scanning line;
a transistor including a semiconductor layer extending in each of the first direction and the second direction;
a first light shielding layer provided in a layer between the first substrate and the transistor, the first light shielding layer overlapping in a plan view with the semiconductor layer;
a first conductive layer provided in a layer between the transistor and the pixel electrode, the first conductive layer being supplied with a constant potential; and
a first interlayer insulating film provided in a layer between the first light shielding layer and the first conductive layer, wherein
the first light shielding layer is electrically coupled to the first conductive layer via a first contact hole and a second contact hole provided in the first interlayer insulating film in a manner extending along the semiconductor layer,
at least a source/drain region in the semiconductor layer extends in a plan view between the first contact hole and the second contact hole,
a first light shielding wall formed of a light shielding conductive material is provided on an inner wall of the first contact hole,
a second light shielding wall formed of a light shielding conductive material is provided on an inner wall of the second contact hole, and
at least a semiconductor layer portion in the semiconductor layer overlaps with an end portion on a source/drain region side of a gate electrode of the transistor via a gate insulating layer, the semiconductor layer onion being located between the first light shielding wall and the second light shielding wall,
the electro-optical device further comprising:
a second light shielding layer overlapping in a plan view with the semiconductor layer in a layer between the first light shielding layer and the semiconductor layer,
a third contact hole penetrating through a second interlayer insulating film interposed between the second light shielding layer and the gate electrode on an opposite side of the semiconductor layer portion to the source/drain region in a region overlapping in a plan view with the scanning line, and
a third light shielding wall formed of a conductive material covering an inner wall of the third contact hole.

2. The electro-optical device according to claim 1, wherein the source/drain region is electrically coupled to the pixel electrode.

3. The electro-optical device according to claim 1, wherein
the source/drain region includes
a first region electrically coupled to the pixel electrode, and
a second region interposed between a channel region and the first region, the second region having impurity concentration lower than that of the first region, and
the second region is entirely located between the first light shielding wall and the second light shielding wall.

4. The electro-optical device according to claim 1, wherein the first light shielding wall and the second light shielding wall extend in the first direction along the semiconductor layer.

5. The electro-optical device according to claim 1, wherein
the first light shielding wall serves as a first plug for filling the first contact hole, and
the second light shielding wall serves as a second plug for filling the second contact hole.

6. The electro-optical device according to claim 1, wherein the first conductive layer has a light shielding property, and overlaps in a plan view with the semiconductor layer portion.

7. The electro-optical device according to claim 1, wherein the first light shielding layer extends in the first direction to overlap in a plan view with the scanning line.

8. The electro-optical device according to claim 1, wherein
the gate electrode includes
a first electrode portion overlapping with the semiconductor layer, and a second electrode portion overlapping in a plan view with the scanning line, the second electrode portion protruding from the first electrode portion toward an opposite side to the source/drain region, and the third contact hole is provided at a position overlapping in a plan view with the second light shielding layer and the second electrode portion.

9. The electro-optical device according to claim 1, wherein
the scanning line is provided in a layer between the gate electrode and the pixel electrode, and
the gate electrode is electrically coupled, on an opposite side of the semiconductor layer portion to the source/drain region, to the scanning line via a fourth contact hole penetrating through a third interlayer insulating film interposed between the gate electrode and the scanning line.

10. The electro-optical device according to claim 1, including a second conductive layer provided in a layer between the first conductive layer and the pixel electrode, wherein
the second interlayer insulating film is provided with
a fifth contact hole penetrating through a fourth interlayer insulating film in the second interlayer insulating film to partially communicate with the first contact hole, the fourth interlayer insulating film being interposed between the first conductive layer and the second conductive layer, and
a sixth contact hole penetrating through the fourth interlayer insulating film to partially communicate with the second contact hole, and
the first light shielding wall is integrally provided from the fifth contact hole to the first contact hole, and
the second light shielding wall is integrally provided from the sixth contact hole to the second contact hole.

11. The electro-optical device according to claim 10, wherein
the second conductive layer includes a first capacitance electrode,
between the first conductive layer and the pixel electrode is provided a second capacitance electrode overlapping in a plan view with the first capacitance electrode via a dielectric layer, and the second capacitance electrode is electrically coupled to the pixel electrode.

12. The electro-optical device according to claim 1, including
a second substrate facing the first substrate;
a common electrode formed on a surface on a first substrate side of the second substrate; and
an electro-optical layer provided between the first substrate and the second substrate, wherein
the electric potential serves as a common electric potential applied to the common electrode.

13. An electronic apparatus comprising the electro-optical device according to claim 1.

14. An electro-optical device comprising:
a first substrate;
a pixel electrode provided on one surface side of the first substrate;
a scanning line provided in a layer between the first substrate and the pixel electrode, the scanning line extending in a first direction;
a data line provided in a layer between the first substrate and the pixel electrode, the data line extending in a second direction intersecting the scanning line;
a transistor including a semiconductor layer extending in each of the first direction and the second direction;
a first light shielding layer provided in a layer between the first substrate and the transistor, the first light shielding layer overlapping in a plan view with the semiconductor layer;
a first conductive layer provided in a layer between the transistor and the pixel electrode, the first conductive layer being supplied with a constant potential; and
a first interlayer insulating film provided in a layer between the first light shielding layer and the first conductive layer, wherein
the first light shielding layer is electrically coupled to the first conductive layer via a first contact hole and a second contact hole provided in the first interlayer insulating film in a manner extending along the semiconductor layer,
at least a source/drain region in the semiconductor layer extends in a plan view between the first contact hole and the second contact hole, a first light shielding wall formed of a light shielding conductive material is provided on an inner wall of the first contact hole,
a second light shielding wall formed of a light shielding conductive material is provided on an inner wall of the second contact hole, and
at least a semiconductor layer portion in the semiconductor layer overlaps with an end portion on a source/drain region side of a gate electrode of the transistor via a gate insulating layer, the semiconductor layer portion being located between the first light shielding wall and the second light shielding wall,
the electro-optical device further comprising:
a second conductive layer provided in a layer between the first conductive layer and the pixel electrode, wherein
the second interlayer insulating film is provided with
a fifth contact hole penetrating through a fourth interlayer insulating film in the second interlayer insulating film to partially communicate with the first contact hole, the fourth interlayer insulating film being interposed between the first conductive layer and the second conductive layer, and
a sixth contact hole penetrating through the fourth interlayer insulating film to partially communicate with the second contact hole, and
the first light shielding wall is integrally provided from the fifth contact hole to the first contact hole, and
the second light shielding wall is integrally provided from the sixth contact hole to the second contact hole.

* * * * *